US012736080B2

(12) United States Patent
Shen et al.

(10) Patent No.: US 12,736,080 B2
(45) Date of Patent: Sep. 15, 2026

(54) HINGE MECHANISM WITH TRACK SLOTS AND ELECTRONIC DEVICE

(71) Applicant: Huawei Technologies Co., Ltd., Shenzhen (CN)

(72) Inventors: Hewen Shen, Dongguan (CN); Tuo Shi, Shanghai (CN); Ding Zhong, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 108 days.

(21) Appl. No.: 18/811,002

(22) Filed: Aug. 21, 2024

(65) Prior Publication Data

US 2024/0410417 A1 Dec. 12, 2024

Related U.S. Application Data

(63) Continuation of application No. PCT/CN2024/080608, filed on Mar. 7, 2024.

(30) Foreign Application Priority Data

Apr. 27, 2023 (CN) ........................ 202310480902.9

(51) Int. Cl.
*F16C 11/00* (2006.01)
*F16C 11/04* (2006.01)
(Continued)

(52) U.S. Cl.
CPC ............ *F16C 11/04* (2013.01); *H05K 5/0226* (2013.01)

(58) Field of Classification Search
CPC ......... F16C 11/04; H05K 5/0226; H05K 5/02; G06F 1/1652; G06F 1/1616; G06F 1/16;
(Continued)

(56) References Cited

U.S. PATENT DOCUMENTS 11,846,998 B2 * 12/2023 Wu ...................... H05K 5/0226
11,977,421 B2 * 5/2024 Yang ..................... G06F 1/1681
(Continued)

FOREIGN PATENT DOCUMENTS

CN 1493800 A 5/2004
CN 202646579 U 1/2013
(Continued)

*Primary Examiner* — Rockshana D Chowdhury
(74) *Attorney, Agent, or Firm* — Slater Matsil, LLP

(57) ABSTRACT

A hinge mechanism includes a main shaft and a rotating module. The rotating module includes a first rotating assembly, a second rotating assembly, a first housing mounting bracket, and a second housing mounting bracket. The first rotating assembly includes a first swing arm, a first support arm, and a first connector. The first connector is separately rotatably connected to the first swing arm and the first support plate, and the first connector is capable of moving along a first track slot of the main shaft, for limitation on a movement track of the first connector. The second rotating assembly includes a second swing arm, a second support arm, and a second connector. The second connector is separately rotatably connected to the second swing arm and the second support arm, and the second connector is capable of moving along a second track slot of the main shaft.

20 Claims, 10 Drawing Sheets

(51) Int. Cl.
*H05K 5/00* (2025.01)
*H05K 5/02* (2006.01)

(58) Field of Classification Search
CPC ...... G06F 1/1681; G09F 9/301; H04M 1/022; H04M 1/0268; H04M 1/0216
See application file for complete search history.

(56) References Cited

U.S. PATENT DOCUMENTS 12,147,276 B2 * 11/2024 Zheng .................. G06F 1/1616
12,173,541 B2 * 12/2024 Chung .................. G06F 1/1681
12,366,896 B2 * 7/2025 Zhang .................. G06F 1/1681
12,366,897 B2 * 7/2025 Mao ...................... G06F 1/1652
12,389,558 B2 * 8/2025 Shin ...................... G06F 1/1616
12,429,925 B2 * 9/2025 Zhang .................. G06F 1/1616
12,487,643 B2 * 12/2025 Xu ........................ G06F 1/1652
2020/0409427 A1 * 12/2020 Hsu ....................... G06F 1/1681
2021/0034117 A1 * 2/2021 Torres ....................... E05D 3/06
2022/0236774 A1 * 7/2022 Kim ...................... G06F 1/1652
2022/0413562 A1 * 12/2022 Kim ...................... G06F 1/1652
2023/0076291 A1 * 3/2023 Yun ....................... H04M 1/022
2023/0240029 A1 * 7/2023 Hashimoto .......... H05K 5/0226
2024/0023261 A1 * 1/2024 Park ...................... G06F 1/1618
2024/0344553 A1 * 10/2024 Yang ....................... F16C 11/10
2024/0357025 A1 * 10/2024 Zhang ................... H04M 1/022
2024/0410417 A1 * 12/2024 Shen ........................ F16C 11/04
2025/0165040 A1 * 5/2025 Chen ..................... G06F 1/1681
2025/0243895 A1 * 7/2025 Liang ...................... F16C 11/04
2025/0284323 A1 * 9/2025 Wu ....................... G06F 1/1681
2025/0298441 A1 * 9/2025 Lin ....................... G06F 1/1652

FOREIGN PATENT DOCUMENTS

CN 103423410 A 12/2013
CN 104575228 A 4/2015
CN 110735848 A 1/2020
CN 110748553 A 2/2020
CN 111399593 A 7/2020
CN 211082539 U 7/2020
CN 211082540 U 7/2020
CN 109936648 B 8/2020
CN 111866221 A 10/2020
CN 112901645 A 6/2021
CN 113606309 A 11/2021
CN 114185398 A * 3/2022 ........... G06F 1/1616
CN 115451008 A 12/2022
EP 4395289 A2 7/2024
WO 2021129882 A1 7/2021
WO 2022052721 A1 3/2022
WO 2022262781 A1 12/2022

* cited by examiner

HINGE MECHANISM WITH TRACK SLOTS AND ELECTRONIC DEVICE

CROSS-REFERENCE TO RELATED APPLICATIONS

This application is a continuation of PCT/CN2024/080608, filed on Mar. 7, 2024, which claims priority to Chinese Patent Application No. 202310480902.9, filed on Apr. 27, 2023. The disclosures of the aforementioned applications are hereby incorporated by reference in their entireties.

TECHNICAL FIELD

This application relates to the field of electronic device technologies, and in particular, to a hinge mechanism and an electronic device.

BACKGROUND

Gradual maturity of flexible display technologies brings great changes to display of an electronic device. Foldable mobile phones, tablet computers, or wearable electronic devices with flexible displays, are an important trend of evolutions for intelligent electronic devices in the future.

A key component of a foldable electronic device is a flexible display featured by continuousness and foldability. A hinge mechanism, as an important component for folding the foldable electronic device, can drive the flexible display to be flattened or bent in a process of unfolding and folding the foldable electronic device.

In the current foldable electronic device, the hinge mechanism uses a complex movement assembly to avoid squeezing or pulling the flexible display in a folding process while implementing a folding function, usually ending up in too large a size of the hinge mechanism to satisfy a compact design for the entire foldable electronic device. In view of this, how to ensure structural reliability of the flexible display while implementing a compact design for the hinge mechanism has become a major difficulty to be urgently resolved by a person skilled in the art.

SUMMARY

This application provides a hinge mechanism and an electronic device, to reduce a size of the hinge mechanism of the electronic device, and ensure structural reliability of a flexible display in a rotation process of the hinge mechanism, thereby improving structural reliability of the electronic device.

According to a first aspect, this application provides a hinge mechanism. The hinge mechanism may be used in a foldable electronic device, the hinge mechanism is disposed opposite to a foldable part of a flexible display of the electronic device, and the electronic device is unfolded or folded via the hinge mechanism. During specific disposing, the hinge mechanism may include a main shaft and a rotating module. The rotating module includes a first rotating assembly, a second rotating assembly, a first housing mounting bracket, and a second housing mounting bracket, the first housing mounting bracket and the second housing mounting bracket are respectively disposed on two opposite sides of the main shaft, the first rotating assembly is located between the first housing mounting bracket and the second housing mounting bracket, and the second rotating assembly is located between the first housing mounting bracket and the second housing mounting bracket. The first rotating assembly may include a first swing arm, a first support arm, and a first connector, the first swing arm is rotatably connected to the main shaft, the first swing arm is slidably connected to the first housing mounting bracket, the first support arm is rotatably connected to the second housing mounting bracket, the first connector is located between the first swing arm and the first support arm, the first connector is rotatably connected to the first swing arm, and the first connector is rotatably connected to the first support arm. In addition, the main shaft is provided with a first track slot, and the first connector is capable of moving along the first track slot, for limitation on a movement track of the first connector, so that a track along which the first swing arm pulls, via the first connector, the first support arm to move may be limited. The second rotating assembly may include a second swing arm, a second support arm, and a second connector, the second swing arm is rotatably connected to the main shaft, the second swing arm is slidably connected to the second housing mounting bracket, the second support arm is rotatably connected to the first housing mounting bracket, the second connector is located between the second swing arm and the second support arm, the second connector is rotatably connected to the second swing arm, and the second connector is rotatably connected to the second support arm. In addition, the main shaft is provided with a second track slot, and the second connector is capable of moving along the second track slot, for limitation on a movement track of the second connector, so that a track along which the second swing arm pulls, via the second connector, the second support arm to move may be limited.

Based on the foregoing hinge mechanism in this application, in a process in which the electronic device changes from an unfolded state to a folded state, the first housing mounting bracket and the second housing mounting bracket move toward each other. When the first housing mounting bracket drives the first swing arm to rotate around the main shaft clockwise, the first swing arm may drive the first connector to move toward the first swing arm in the first track slot of the main shaft, to drive the first support arm to rotate around the main shaft counter-clockwise. When the second housing mounting bracket drives the second swing arm to rotate around the main shaft counter-clockwise, the second swing arm may drive the second connector to move toward the second swing arm in the second track slot of the main shaft, to drive the second support arm to rotate around the main shaft clockwise. In a process in which the electronic device changes from the folded state to the unfolded state, the first housing mounting bracket and the second housing mounting bracket move away from each other. When the first housing mounting bracket drives the first swing arm to rotate around the main shaft counter-clockwise, the first swing arm may drive the first connector to move toward the first support arm in the first track slot of the main shaft, to drive the first support arm to rotate around the main shaft clockwise. When the second housing mounting bracket drives the second swing arm to rotate around the main shaft clockwise, the second swing arm may drive the second connector to move toward the second support arm in the second track slot of the main shaft, to drive the second support arm to rotate around the main shaft counter-clockwise. In this way, folding and unfolding functions of the hinge mechanism may be implemented.

Some existing hinge mechanisms need to thicken a rotating assembly connected to a main shaft to ensure stability of the mechanisms. In this way, both the main shaft and the hinge mechanism are very heavy. If the main shaft and the hinge mechanism are forcibly thinned, strength of the rotating assembly is easily weakened, thereby greatly affecting reliability of the hinge mechanisms and shortening a life of the electronic device. The foregoing hinge mechanism in this application has a simplified structure. According to the foregoing structural relationship, the first connector and the second connector slide in the main shaft to link the first swing arm, the second swing arm, the first support arm, and the second support arm on the left and right sides. Therefore, the first connector and the second connector do not need to be manufactured with very thick thickness sections to travel back and forth in the first track slot and the second track slot of the main shaft. In addition, because the first connector and the second connector are respectively connected to the first swing arm (the second swing arm) and the first support arm (the second support arm), the first connector (the second connector) has a sufficient length extension along a vertical axial direction to have sufficient strength. This can ensure reliability of the hinge mechanism. In this way, the thickness of the main shaft and the thickness of the entire electronic device can be reduced, and reliability of the hinge mechanism can be maintained, so that the entire hinge mechanism is light, thin, and reliable.

In addition, because the first connector is capable of moving in the first track slot according to a specified track, and the second connector is capable of moving in the second track slot according to a specified track, uncontrolled movement of the first connector and the second connector in an entire folding and unfolding process can be avoided, and random movement of the first housing mounting bracket and the second housing mounting bracket can further be avoided, to ensure structural stability and movement stability of the entire hinge mechanism. In some cases, the first track slot and the second track slot are appropriately designed, so that an outer tangent line of the hinge mechanism can keep a constant length in the entire folding and unfolding process, and a flexible display covering the surface of the hinge mechanism can also basically keep a length unchanged. In this way, squeezing or pulling on the flexible display can be effectively avoided, to improve structural reliability of the flexible display and further improve structural reliability of the electronic device.

In a possible implementation of this application, the main shaft includes a base and a cover, the cover covers the base, the base is provided with a first arc-shaped slot, the cover includes a first protrusion disposed toward the first arc-shaped slot, and a gap between a surface of the first protrusion and a slot surface of the first arc-shaped slot may be used as the first track slot. In addition, the first connector may include a first arc-shaped surface and a second arc-shaped surface, and when the electronic device is in the unfolded state and the folded state, the first arc-shaped surface abuts against the surface of the first protrusion, and the second arc-shaped surface abuts against the slot surface of the first arc-shaped slot. In this way, the surface of the first protrusion and the slot surface of the first arc-shaped slot limit the first connector to the first track slot, so that when the hinge mechanism is in the unfolded state and the folded state, the first connector is relatively stable without any gap-caused shake, and reliability of the hinge mechanism is improved in the foregoing two states.

In addition, the base may further be provided with a third arc-shaped slot, and the cover further includes a third protrusion disposed toward the third arc-shaped slot. A gap between a surface of the third protrusion and a slot surface of the third arc-shaped slot is used as the second track slot, the second connector includes a third arc-shaped surface and a fourth arc-shaped surface, and when the electronic device is in the unfolded state and the folded state, the third arc-shaped surface abuts against the surface of the third protrusion, and the fourth arc-shaped surface abuts against the slot surface of the third arc-shaped slot. In this way, the surface of the third protrusion and the slot surface of the third arc-shaped slot limit the second connector to the second track slot, so that when the hinge mechanism is in the unfolded state and the folded state, the second connector is relatively stable without any gap-caused shake, and reliability of the hinge mechanism is improved in the foregoing two states.

In a possible implementation of this application, in the process in which the electronic device changes from the unfolded state to the folded state, the first arc-shaped surface abuts against the surface of the first protrusion, and a gap exists between the second arc-shaped surface and the slot surface of the first arc-shaped slot. However, in the process in which the electronic device changes from the folded state to the unfolded state, the second arc-shaped surface abuts against the slot surface of the first arc-shaped slot, and a gap exists between the first arc-shaped surface and the surface of the first protrusion. Therefore, a movement track of the first connector in the first track slot in the process in which the electronic device changes from the unfolded state to the folded state is different from a movement track of the first connector in the first track slot in the process in which the electronic device changes from the folded state to the unfolded state. This helps improve flexibility of design for the hinge mechanism.

In addition, in the process in which the electronic device changes from the unfolded state to the folded state, the third arc-shaped surface abuts against the surface of the third protrusion, and a gap exists between the fourth arc-shaped surface and the slot surface of the third arc-shaped slot. In the process in which the electronic device changes from the folded state to the unfolded state, the fourth arc-shaped surface abuts against the slot surface of the third arc-shaped slot, and a gap exists between the third arc-shaped surface and the surface of the third protrusion. Therefore, a movement track of the second connector in the second track slot in the process in which the electronic device changes from the unfolded state to the folded state is different from a movement track of the second connector in the second track slot in the process in which the electronic device changes from the folded state to the unfolded state. This helps improve flexibility of design for the hinge mechanism.

In this application, the movement track of the first connector in the first track slot in the process in which the electronic device changes from the unfolded state to the folded state may be further enabled to be the same as the movement track of the first connector in the first track slot in the process in which the electronic device changes from the folded state to the unfolded state. Specifically, the surface of the first protrusion may be equidistant from the slot surface of the first arc-shaped slot, and in this case, the first track slot is an equal-width slot. In the processes in which the electronic device changes from the unfolded state to the folded state and from the folded state to the unfolded state, the first arc-shaped surface abuts against the surface of the first protrusion, and the second arc-shaped surface abuts against the slot surface of the first arc-shaped slot. This can help improve movement stability of the first connector in the first track slot. Similarly, the surface of the third protrusion may also be equidistant from the slot surface of the third arc-shaped slot, and in this case, the second track slot is an equal-width slot. In addition, in the processes in which the electronic device changes from the unfolded state to the folded state and from the folded state to the unfolded state, the third arc-shaped surface abuts against the surface of the third protrusion, and the fourth arc-shaped surface abuts against the slot surface of the third arc-shaped slot. In this way, the movement track of the second connector in the second track slot in the process in which the electronic device changes from the unfolded state to the folded state is the same as the movement track of the second connector in the second track slot in the process in which the electronic device changes from the folded state to the unfolded state, to improve movement stability of the second connector in the third track slot.

In a possible implementation of this application, the first arc-shaped surface of the first connector may be a circular are surface, and the second arc-shaped surface may also be a circular are surface. In this case, a sum of a radius of the first arc-shaped surface and a radius of the second arc-shaped surface may be equal to a spacing between the surface of the first protrusion and the slot surface of the first arc-shaped slot, to improve smoothness of movement of the first connector in the first track slot.

Similarly, the third arc-shaped surface of the second connector may be a circular are surface, and the fourth arc-shaped surface may also be a circular are surface. In this case, a sum of a radius of the third arc-shaped surface and a radius of the fourth arc-shaped surface may be equal to a spacing between the surface of the third protrusion and the slot surface of the third arc-shaped slot, to improve smoothness of movement of the second connector in the second track slot.

In this application, the first swing arm is rotatably connected to the main shaft. The base is provided with a second arc-shaped slot, the first swing arm includes a first arc-shaped rotating block, the first arc-shaped rotating block is accommodated in the second arc-shaped slot, and the first arc-shaped rotating block is capable of sliding along a slot surface of the second arc-shaped slot, for rotatable connection between the first swing arm and the main shaft. Therefore, the first swing arm is rotatably connected to the main shaft in a virtual shaft manner. This helps reduce space occupied by the first swing arm on the main shaft, to help implement a compact design for the hinge mechanism.

In addition, the second swing arm is also rotatably connected to the main shaft. The base is further provided with a fourth arc-shaped slot, the second swing arm includes a second arc-shaped rotating block, the second arc-shaped rotating block is accommodated in the fourth arc-shaped slot, and the second arc-shaped rotating block is capable of sliding along a slot surface of the fourth arc-shaped slot, for rotatable connection between the second swing arm and the main shaft. Therefore, the second swing arm is rotatably connected to the main shaft in a virtual shaft manner. This helps reduce space occupied by the second swing arm on the main shaft, to help implement a compact design for the hinge mechanism.

It may be understood that, for an outward folding electronic device, when the first swing arm is rotatably connected to the main shaft via a virtual shaft or a solid shaft, an axis center at which the first swing arm rotates around the main shaft is located on one side that is of the main shaft and that is away from the flexible display. In addition, when the second swing arm is rotatably connected to the main shaft via a virtual shaft or a solid shaft, an axis center at which the second swing arm rotates around the main shaft is located on the side that is of the main shaft and that is away from the flexible display.

To improve reliability of the connection between the first swing arm and the main shaft, in this application, the cover further includes a second protrusion disposed toward the second arc-shaped slot, and at least a part of the first arc-shaped rotating block is located between the second protrusion and the second arc-shaped slot, so that the first swing arm is limited to the main shaft via the second protrusion and the second arc-shaped slot, and the first swing arm may be prevented from falling off from the second arc-shaped slot.

In addition, the cover further includes a fourth protrusion disposed toward the fourth arc-shaped slot, and at least a part of the second arc-shaped rotating block is located between the fourth protrusion and the fourth arc-shaped slot, so that the second swing arm is limited to the main shaft via the fourth protrusion and the fourth arc-shaped slot, and the second swing arm may be prevented from falling off from the fourth arc-shaped slot.

In a possible implementation of this application, the first connector includes a first rotating shaft and a second rotating shaft, the first connector is rotatably connected to the first swing arm via the first rotating shaft, the first connector is rotatably connected to the first support arm via the second rotating shaft, and an axis of the first rotating shaft is parallel to and does not coincide with an axis of the second rotating shaft, so that the first swing arm and the first support arm can implement mutual pulling movement via the first connector.

The second connector includes a third rotating shaft and a fourth rotating shaft, the second connector is rotatably connected to the second swing arm via the third rotating shaft, the second connector is rotatably connected to the second support arm via the fourth rotating shaft, and an axis of the third rotating shaft is parallel to and does not coincide with an axis of the fourth rotating shaft, so that the second swing arm and the second support arm can implement mutual pulling movement via the second connector.

Specifically, when the first swing arm is rotatably connected to the first connector via the first rotating shaft, the first arc-shaped rotating block may be provided with a first mounting slot, and a slot opening of the first mounting slot is disposed toward the second arc-shaped slot. The first rotating shaft is mounted in the first mounting slot, a part of a surface of the first rotating shaft is in contact with a slot surface of the first mounting slot, and a part of the surface of the first rotating shaft is in contact with the slot surface of the second arc-shaped slot. The first rotating shaft is mounted in the opened first mounting slot of the first arc-shaped rotating block to be in contact with the slot surface of the second arc-shaped slot, so that a size of the first arc-shaped rotating block can be effectively reduced, and a thickness of the first mounting slot does not need to be increased due to a size of the first rotating shaft. This helps a compact design for the hinge mechanism.

In addition, the slot surface of the first mounting slot includes a first circular are surface, the surface that is of the first rotating shaft and that is in contact with the slot surface of the first mounting slot is a second circular are surface, and a center of the first circular are surface coincides with a center of the second circular are surface. In this way, the first rotating shaft rotates relative to the first arc-shaped rotating block in a process in which the first arc-shaped rotating block slides along the slot surface of the second arc-shaped slot, for rotatable connection between the first swing arm and the first rotating shaft.

The slot surface of the second arc-shaped slot is a third circular are surface, the surface that is of the first rotating shaft and that is in contact with the slot surface of the second arc-shaped slot is a fourth circular are surface, and a center of the third circular are surface coincides with a center of the fourth circular are surface. In this way, when the first rotating shaft slides along the slot surface of the second arc-shaped slot with the first arc-shaped rotating block, the first rotating shaft may further rotate relative to the first arc-shaped rotating block and the second arc-shaped slot, to help implement movement of the first connector relative to the main shaft.

Similarly, the second arc-shaped rotating block is provided with a second mounting slot, a slot opening of the second mounting slot is disposed toward the fourth arc-shaped slot, the third rotating shaft is mounted in the open second mounting slot to be in contact with the slot surface of the fourth arc-shaped slot, a part of a surface of the third rotating shaft is in contact with a slot surface of the second mounting slot, and a part of the surface of the third rotating shaft is in contact with the slot surface of the fourth arc-shaped slot. The third rotating shaft is mounted in the second mounting slot of the second arc-shaped rotating block, so that a size of the second arc-shaped rotating block can be effectively reduced, and a thickness of the second mounting slot does not need to be increased due to a size of the third rotating shaft. This helps a compact design for the hinge mechanism.

The second mounting slot may include a fifth circular are surface, the surface that is of the third rotating shaft and that is in contact with the slot surface of the second mounting slot is a sixth circular are surface, and a center of the fifth circular are surface coincides with a center of the sixth circular are surface. In addition, the slot surface of the fourth arc-shaped slot is a seventh circular arc surface, and the surface that is of the third rotating shaft and that is in contact with the slot surface of the fourth arc-shaped slot may be an eighth circular are surface. In this case, a center of the seventh circular are surface coincides with a center of the eighth circular are surface. In this way, when the third rotating shaft slides along the slot surface of the fourth arc-shaped slot with the second arc-shaped rotating block, the third rotating shaft may further rotate relative to the second arc-shaped rotating block and the fourth arc-shaped slot, to help implement movement of the second connector relative to the main shaft.

In a possible implementation of this application, the first connector may include a plurality of first sub-connectors that are sequentially rotatably connected. In addition, the plurality of first sub-connectors may be located between the first swing arm and the first support arm, the first swing arm may be rotatably connected to a first sub-connector adjacent to the first swing arm, and the first support arm may be rotatably connected to a first sub-connector adjacent to the first support arm. The first swing arm and the first support arm are connected via the plurality of first sub-connectors. This can effectively improve speed uniformity in a process in which the first swing arm and the first support arm rotate around the main shaft, thereby improving smoothness of mutual pulling movement of the first swing arm and the first support arm.

In addition, the second connector may include a plurality of second sub-connectors that are sequentially rotatably connected. In addition, the plurality of second sub-connectors may be located between the second swing arm and the second support arm, the second swing arm may be rotatably connected to an adjacent second sub-connector, and the second support arm may be rotatably connected to an adjacent second sub-connector. The second swing arm and the second support arm are connected via the plurality of second sub-connectors. This can effectively improve speed uniformity in a process in which the second swing arm and the second support arm rotate around the main shaft, thereby improving smoothness of mutual pulling movement of the second swing arm and the second support arm.

In a possible implementation of this application, the hinge mechanism further includes a synchronization assembly, the synchronization assembly includes a first gear connecting rod and a second gear connecting rod, the first gear connecting rod includes a first gear and a first connecting rod, the first gear is rotatably connected to the main shaft, and the first connecting rod is slidably connected to the first housing mounting bracket. The second gear connecting rod includes a second gear and a second connecting rod, the second gear is rotatably connected to the main shaft, the second connecting rod is slidably connected to the second housing mounting bracket, and the first gear is connected to the second gear in a transmission manner. In this way, in the process in which the electronic device changes from the unfolded state to the folded state or from the folded state to the unfolded state, synchronous movement of the first housing mounting bracket and the second housing mounting bracket that are away from each other can be implemented, which helps improve movement stability of the hinge mechanism. In addition, a risk of instantaneous squeezing or pulling stress on the flexible display of the electronic device can be effectively reduced, to improve structural reliability of the flexible display.

In this application, the first gear may be rotatably connected to the main shaft via the fifth rotating shaft, and the second gear may be rotatably connected to the main shaft via the sixth rotating shaft, to improve rotation stability of the first gear connecting rod and the second gear connecting rod around the main shaft.

In addition, to implement a slidable connection between the first connecting rod and the first housing mounting bracket, the first housing mounting bracket may be further provided with a third sliding groove, and the first connecting rod may be mounted in the third sliding groove, and is capable of sliding in the third sliding groove relative to the first housing mounting bracket toward or away from the base.

When the second connecting rod is slidably connected to the second housing mounting bracket, the second housing mounting bracket is further provided with a fourth sliding groove, and the second connecting rod is mounted in the fourth sliding groove, and is capable of sliding in the fourth sliding groove relative to the second housing mounting bracket toward or away from the base.

According to a second aspect, this application further provides an electronic device. The electronic device includes a first housing, a second housing, a flexible display, and the hinge mechanism in the first aspect. The first housing and the second housing are respectively disposed on two opposite sides of the hinge mechanism, a first housing mounting bracket is fastened to the first housing, and a second housing mounting bracket is fastened to the second housing. The flexible display continuously covers the first housing, the second housing, and the hinge mechanism, and the flexible display is fastened to the first housing and the second housing. When the electronic device is in an unfolded state, the hinge mechanism, the first housing, and the second housing jointly flatly support the flexible display. This can ensure a complete form of the electronic device in the unfolded state. In a process in which the electronic device changes from the unfolded state to the folded state, the two housings rotate toward each other to drive the flexible display to rotate. This can effectively avoid deformation of the flexible display, and reduce a risk of damage to the flexible display.

REFERENCE NUMERALS

Figure 1:
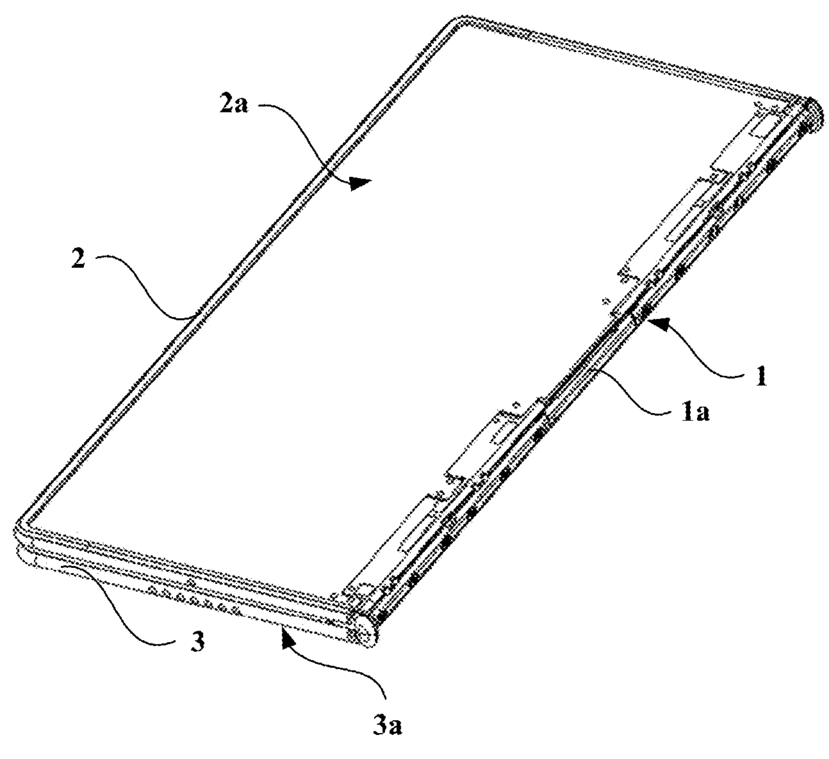
FIG. 1 is a diagram of a structure of an electronic device in a folded state according to an embodiment of this application.

1: hinge mechanism; 1*a*: bearing surface; 1*b*: third appearance surface; 101: rotating module; 1011: first rotating assembly;

10111: first swing arm; 101111: first arc-shaped rotating block; 1011111: first recess; 1011112: first mounting slot;

10111121: first circular arc surface; 10112: first support arm; 10113: first connector; 101131: first rotating shaft;

1011311: second circular are surface; 1011312: fourth circular are surface; 101132: second rotating shaft; 101133: first arc-shaped surface;

101134—second arc-shaped surface;

1012: second rotating assembly; 10121: second swing arm; 101211: second arc-shaped rotating block; 1012111: second recess;

1012112: second mounting slot; 10121121: fifth circular are surface; 10122: second support arm; 10123: second connector;

101231: third rotating shaft; 1012311: sixth circular are surface; 1012312: eighth circular arc surface; 101232: fourth rotating shaft;

101233: third arc-shaped surface; 101234: fourth arc-shaped surface;

1013: first housing mounting bracket; 10131: first sliding groove; 10132: first mounting part; 10133: third sliding groove;

1014: second housing mounting bracket; 10141: second sliding groove; 10142: second mounting part; 10143: fourth sliding groove;

102: main shaft; 1021: base; 10211: first arc-shaped slot; 102111: slot surface of the first arc-shaped slot;

10212: second arc-shaped slot; 102121: third circular are surface; 10213: third arc-shaped slot; 102131: slot surface of the third arc-shaped slot;

10214: fourth arc-shaped slot; 102141: seventh arc-shaped surface;

1022: cover; 10221: first protrusion; 102211: surface of the first protrusion; 10222: second protrusion;

102221: surface of the second protrusion; 10223: first insertion part; 10224: third protrusion; 102241: surface of the third protrusion;

10225: fourth protrusion; 102251: surface of the fourth protrusion;

1023: first track slot; 1024: second track slot;

103: synchronization assembly; 1031: first gear connecting rod; 10311: first gear; 10312: first connecting rod; 10313: fifth rotating shaft;

1032—second gear connecting rod; 10321—second gear; 10322—second connecting rod; 10323—sixth rotating shaft;

2: first housing; 2*a*: first support surface; 2*b*: first appearance surface; and

3: second housing; 3*a*: second support surface; 3*b*: second appearance surface.

DESCRIPTION OF EMBODIMENTS

To make the objectives, technical solutions, and advantages of this application clearer, the following further describes this application in detail with reference to the accompanying drawings. Terms used in the following embodiments of this application are merely intended to describe specific embodiments, but are not intended to limit this application. The terms "one", "a" and "this" of singular forms used in this specification and the appended claims of this application are also intended to include expressions such as "one or more", unless otherwise specified in the context clearly.

Reference to "an embodiment", "some embodiments", or the like described in this specification indicates that one or more embodiments of this application include a specific feature, structure, or characteristic described with reference to embodiments. Therefore, statements such as "in an embodiment", "in some embodiments", "in some other embodiments", and "in other embodiments" that appear at different places in this specification do not necessarily mean referring to a same embodiment. Instead, the statements mean "one or more but not all of embodiments", unless otherwise specifically emphasized in another manner. The terms "include", "have", and their variants all mean "include but are not limited to", unless otherwise specifically emphasized in another manner.

For ease of understanding a hinge mechanism provided in embodiments of this application, the following first describes an application scenario of the hinge mechanism. The hinge mechanism may be used in, but is not limited to, a foldable electronic device like a mobile phone, a palmtop computer (personal digital assistant, PDA), a notebook computer, or a tablet computer. When the hinge mechanism provided in embodiments of this application is used in the electronic device, refer to FIG. 1. FIG. 1 is a diagram of a structure of an electronic device in a folded state according to an embodiment of this application. In addition to a hinge mechanism 1, the electronic device may further include two housings and a flexible display (not shown in FIG. 1). For ease of description, the two housings may be respectively named a first housing 2 and a second housing 3. The first housing 2 and the second housing 3 are located on two sides of the hinge mechanism 1, and can rotate around the hinge mechanism 1. When the electronic device is used, the electronic device may be folded or unfolded in different use scenarios.

In this application, the electronic device may be an outward folding electronic device. In a process in which the outward folding electronic device changes from an unfolded state to a folded state, a flexible display is always located on an outer side of the electronic device. FIG. 1 shows a relative position relationship between the hinge mechanism 1 and the two housings when the electronic device is in a folded state. In this case, a first surface of the hinge mechanism 1, a first surface of the first housing, and a first surface of the second housing may be jointly used as a support surface of the flexible display. The flexible display is omitted in FIG. 1. The first surface of the hinge mechanism 1 is a surface that is of the hinge mechanism 1 and that faces the flexible display. The first surface of the first housing 2 is a surface that is of the first housing 2 and that faces the flexible display. The first surface of the second housing 3 is a surface that is of the second housing 3 and that faces the flexible display. For ease of description, in this application, the first surface of the hinge mechanism 1 may be defined as a bearing surface 1*a* of the hinge mechanism 1, the first surface of the first housing 2 may be defined as a first support surface 2*a*, and the first surface of the second housing 3 may be defined as a second support surface 3*a*.

Figure 2A:
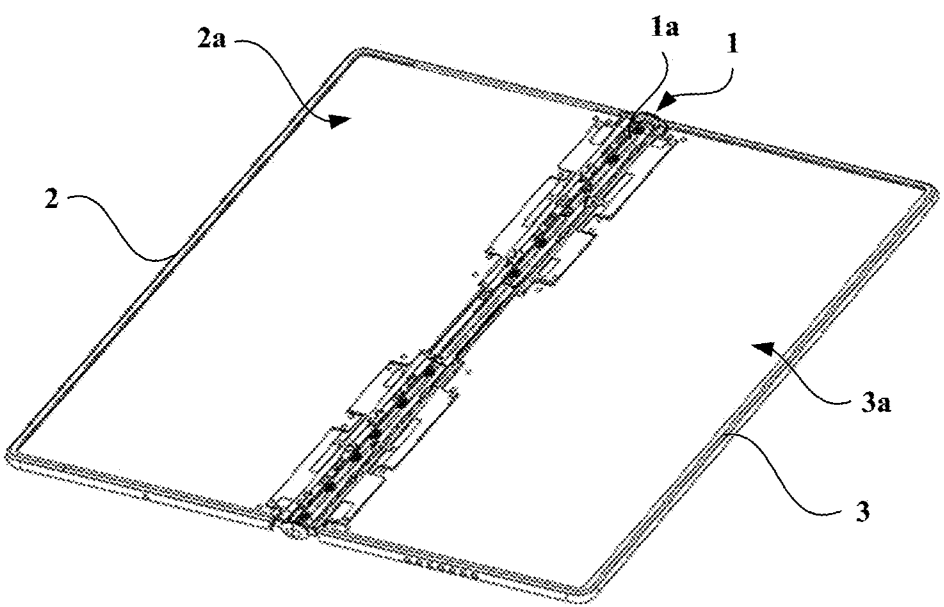
FIG. 2*a* is a diagram of a structure of an electronic device in an unfolded state according to an embodiment of this application.

FIG. 2*a* is a diagram of a structure of an electronic device in an unfolded state, and FIG. 2*a* shows a structure of the first support surface 2*a* of the first housing 2 and a structure of the second support surface 3*a* of the second housing 3. In the unfolded state, the bearing surface 1*a* of the hinge mechanism 1, the first support surface 2*a* of the first housing 2, and the second support surface 3*a* of the second housing 3 may be connected to form a flat support surface.

In view of this, the flexible display may continuously cover the bearing surface 1*a* of the hinge mechanism 1, the first support surface 2*a* of the first housing 2, and the second support surface 3*a* of the second housing 3. The hinge mechanism 1 is disposed opposite to a foldable part of the flexible display, and the flexible display may be fastened to the first support surface 2*a* of the first housing 2 and the second support surface 3*a* of the second housing 3. A connection manner may be but is not limited to bonding. In this way, when the electronic device is in the unfolded state shown in FIG. 2*a*, the hinge mechanism 1, the first housing 2, and the second housing 3 may flatly support the flexible display.

Figure 2B:
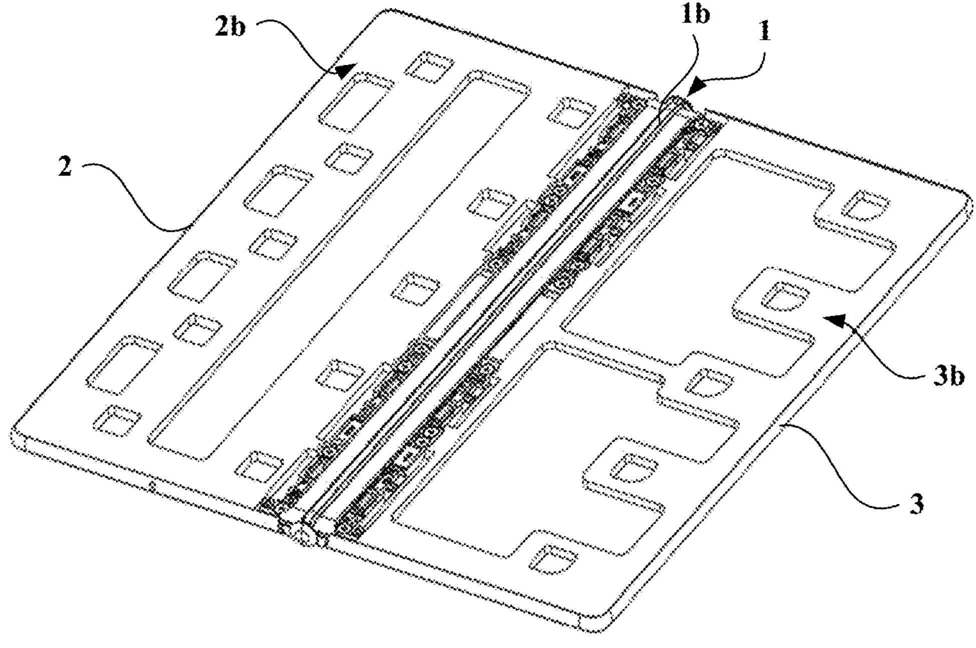
FIG. 2*b* is a diagram of another structure of an electronic device in an unfolded state according to an embodiment of this application.

In addition, FIG. 2*b* is a diagram of another structure of an electronic device in an unfolded state according to an embodiment of this application. FIG. 2*b* shows structures of a second surface of the hinge mechanism 1, a second surface of the first housing 2, and a second surface of the second housing 3. The second surface of the hinge mechanism 1 is a surface that is of the hinge mechanism 1 and that is away from the flexible display, the second surface of the first housing 2 is a surface that is of the first housing 2 and that is away from the flexible display, and the second surface of the second housing 3 is a surface that is of the second housing 3 and that is away from the flexible display. In this case, the first surface and the second surface of the hinge mechanism 1 are disposed opposite to each other, the first surface and the second surface of the first housing 2 are disposed opposite to each other, and the first surface and the second surface of the second housing 3 are disposed opposite to each other. In this application, the second surface of the hinge mechanism 1, the second surface of the first housing 2, and the second surface of the second housing 3 may be used as an appearance surface of the electronic device. For ease of description, the second surface of the first housing 2 may be defined as a first appearance surface 2*b*, the second surface of the second housing 3 may be defined as a second appearance surface 3*b*, and the second surface of the hinge mechanism 1 may be defined as a third appearance surface 1*b*. It may be understood that, for the outward folding electronic device, the appearance surface of the electronic device is exposed outside the electronic device when the electronic device is in the unfolded state, and the appearance surface of the electronic device is located inside the electronic device when the electronic device is in the folded state. In this application, in a process in which the first housing 2 and the second housing 3 relatively rotate from the unfolded state shown in FIG. 2*a* or FIG. 2*b* to the folded state shown in FIG. 1 or from the folded state shown in FIG. 1 to the unfolded state shown in FIG. 2*a* or FIG. 2*b*, the flexible display may be bent or flattened with the first housing 2 and the second housing 3. In addition, it may be understood that a process in which the electronic device changes from the unfolded state shown in FIG. 2*a* or FIG. 2*b* to the folded state shown in FIG. 1 or from the folded state shown in FIG. 1 to the unfolded state shown in FIG. 2*a* or FIG. 2*b* is a process in which the first housing 2 and the second housing 3 rotate around the hinge mechanism 1. The hinge mechanism 1 is used as a key functional component in a foldable electronic device, and may be disposed corresponding to a foldable part of the flexible display. Therefore, in both the unfolded state shown in FIG. 2*a* or FIG. 2*b* and the folded state shown in FIG. 1, the hinge mechanism 1 plays an important role in supporting the foldable part of the flexible display.

To implement a rotation function and avoid squeezing or pulling the flexible display in a folding process of the electronic device, a hinge mechanism tends to be set to include a plurality of interconnected connectors as a movement assembly that moves in a specified track through mutual pulling movement of the connectors. However, the existing hinge mechanism is usually structured with complexity into a large size at high costs.

The hinge mechanism provided in this application is intended to resolve the foregoing problem, so that a size of the hinge mechanism is reduced, a structure of the hinge mechanism is simplified, and a weight of the hinge mechanism is reduced by optimizing a rotating module that is in the hinge mechanism and that is configured to implement the rotation function. In this way, space occupied by the hinge mechanism in the entire electronic device is reduced, and more space is reserved for disposing other components, to help improve performance of the electronic device. In addition, a movement track of the rotating module that is in the hinge mechanism and that is configured to implement the rotation function is appropriately designed, to avoid squeezing or pulling the flexible display in the folding process of the electronic device, thereby improving structural reliability of the flexible display, and prolonging a service life of the flexible display. To facilitate understanding of the hinge mechanism provided in embodiments of this application, the following describes a specific structure of the hinge mechanism in detail with reference to the accompanying drawings.

Figure 3:
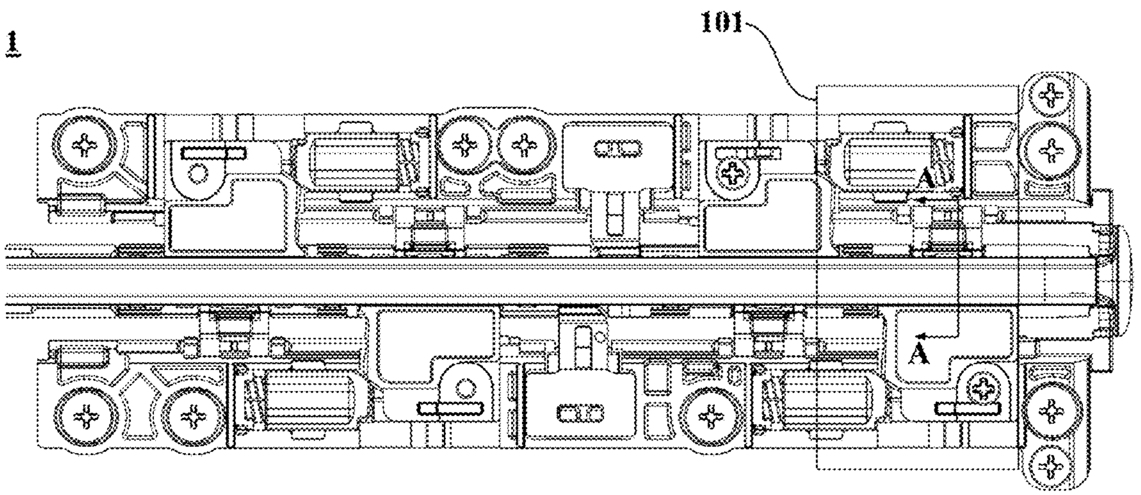
FIG. 3 is a diagram of a partial structure of a hinge mechanism of the electronic device in FIG. 2*b;*

FIG. 3 is a diagram of a partial structure of the hinge mechanism 1 of the electronic device in FIG. 2*b*. In this application, the hinge mechanism 1 may include a rotating module 101. A quantity of rotating modules 101 in the hinge mechanism 1 is not limited in this application. The hinge mechanism 1 may include only one rotating module 101, or may include a plurality of rotating modules 101. When the hinge mechanism 1 includes a plurality of rotating modules 101, the plurality of rotating modules 101 may be arranged at spacings along a length direction of the hinge mechanism 1. In this application, the length direction of the hinge mechanism 1 is an extension direction of an axis along which the first housing 2 and the second housing 3 rotate around the hinge mechanism 1 shown in FIG. 2*b*. It may be understood that the first housing 2 and the second housing 3 are rotatably connected via the plurality of rotating modules 101. This can effectively improve rotation stability of the first housing 2 and the second housing 3 of the electronic device relative to the hinge mechanism 1.

Figure 4:
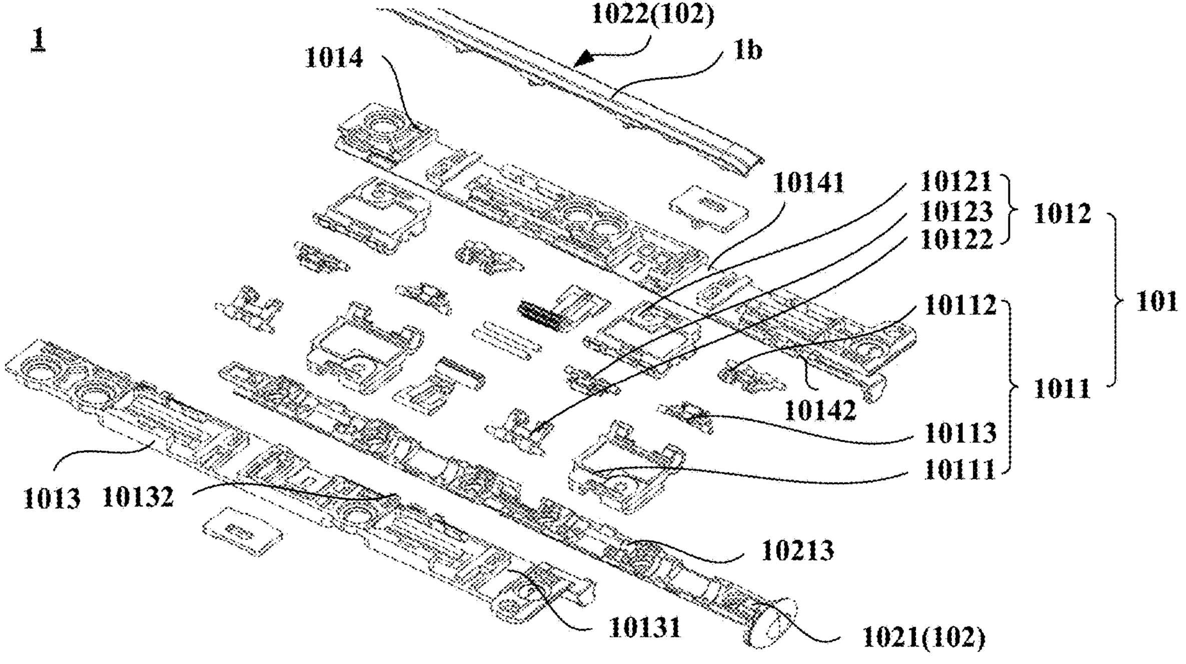
FIG. 4 is an exploded view of the structure shown in FIG. 3.

For ease of understanding a structure of the rotating module 101, refer to FIG. 4. FIG. 4 is an exploded view of the hinge mechanism 1 shown in FIG. 3. The rotating module 101 may include a first rotating assembly 1011 and a second rotating assembly 1012. In addition, as shown in FIG. 4, the hinge mechanism 1 may further include a main shaft 102. The main shaft 102 may be used as a bearing component of the first rotating assembly 1011 and the second rotating assembly 1012.

It should be noted that, in embodiments of this application, when there are a plurality of rotating modules 101, first rotating assemblies 1011 and second rotating assemblies 1012 of the plurality of rotating modules 101 may all use the same main shaft 102 as the bearing component, to improve an integration degree of the hinge mechanism 1. In some other possible embodiments of this application, one main shaft 102 may be correspondingly disposed for each rotating module 101 in the hinge mechanism 1, so that a corresponding main shaft 102 is used as a bearing component for a first rotating assembly 1011 and a second rotating assembly 1012 of each rotating module 101.

Still refer to FIG. 4. The first rotating assembly 1011 may include a first swing arm 10111, a first support arm 10112, and a first connector 10113. The first connector 10113 is located between the first swing arm 10111 and the first support arm 10112, the first connector 10113 is rotatably connected to the first swing arm 10111, and the first connector 10113 is rotatably connected to the first support arm 10112, so that the first swing arm 10111 and the first support arm 10112 perform mutual pulling movement via the first connector 10113. In view of this, it may be understood that a movement track of the first connector 10113 plays a key role in a movement track of the first rotating assembly 1011.

Figure 5:
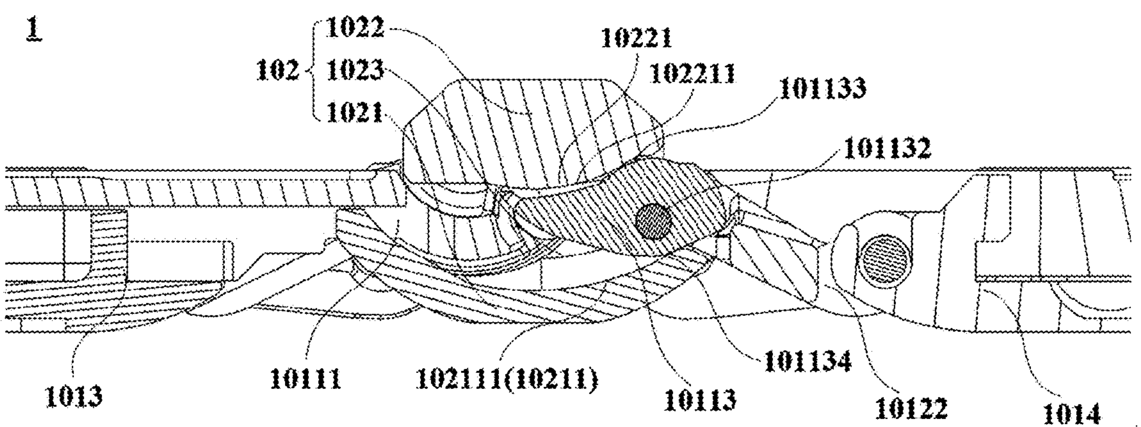
FIG. 5 is a sectional view of a first connector of a hinge mechanism when an electronic device is in an unfolded state according to an embodiment of this application.

In this application, the first connector 10113 is capable of moving relative to the main shaft 102. In practice, refer to FIG. 5. FIG. 5 is a sectional view of the first connector 10113 of the hinge mechanism 1 when the electronic device is in the unfolded state according to an embodiment of this application. The main shaft 102 may be provided with a first track slot 1023, and the first connector 10113 is capable of moving along the first track slot 1023, for limitation on a movement track of the first connector 10113.

Figure 6:
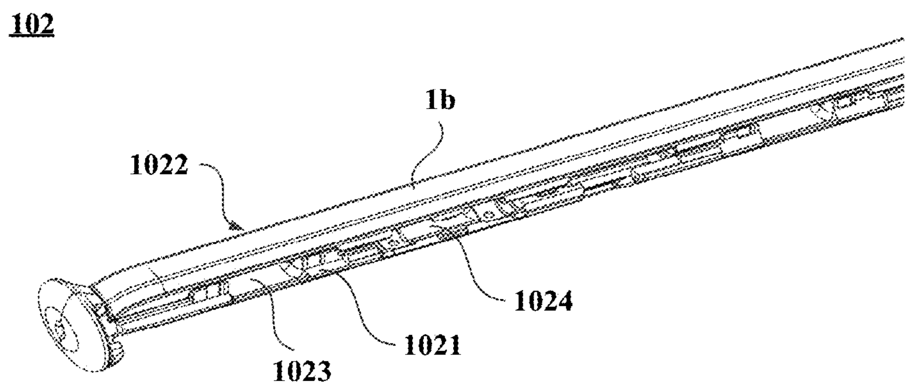
FIG. 6 is a diagram of a structure of a main shaft according to an embodiment of this application.
Figure 7:
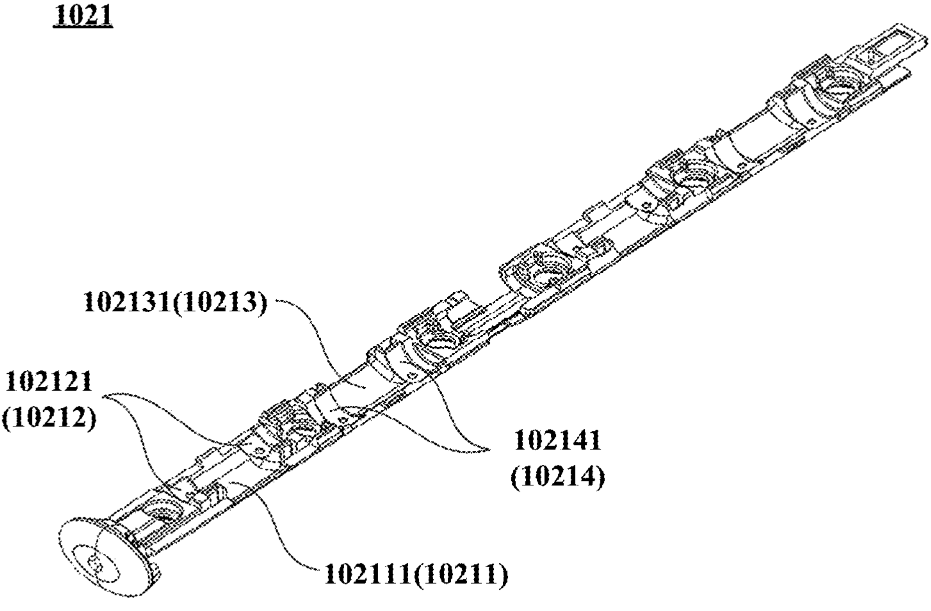
FIG. 7 is a diagram of a structure of a base of the main shaft shown in FIG. 6.
Figure 8:
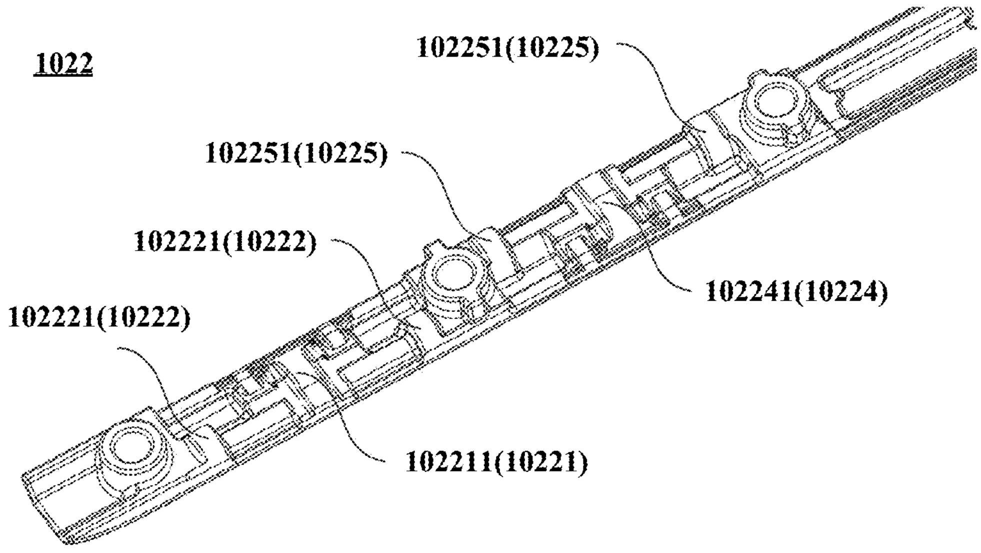
FIG. 8 is a diagram of a structure of a cover of the main shaft shown in FIG. 6.

FIG. 6 is a diagram of a structure of the main shaft 102 according to an embodiment of this application. The main shaft 102 may further include a base 1021 and a cover 1022. The cover 1022 covers the base 1021, and an outer surface of the cover 1022 may be used as the third appearance surface 1*b* of the hinge mechanism 1. FIG. 7 is a diagram of a structure of the base 1021 of the main shaft 102 shown in FIG. 6. The base 1021 may be provided with a first arc-shaped slot 10211. Refer to FIG. 5 and FIG. 7 together. The first connector 10113 is accommodated in the first arc-shaped slot 10211, and the first connector 10113 is capable of sliding along a slot surface 102111 of the first arc-shaped slot. In addition, FIG. 8 is a diagram of a structure of the cover 1022 of the main shaft 102 shown in FIG. 6. FIG. 8 is used to show a structure of a side that is of the cover 1022 and that faces the base 1021. The cover 1022 includes a first protrusion 10221. As shown in FIG. 5, the first protrusion 10221 may be disposed toward the first arc-shaped slot 10211. A gap exists between a surface 102211 of the first protrusion and the slot surface 102111 of the first arc-shaped slot, and the gap is used as the first track slot 1023.

Figure 9:
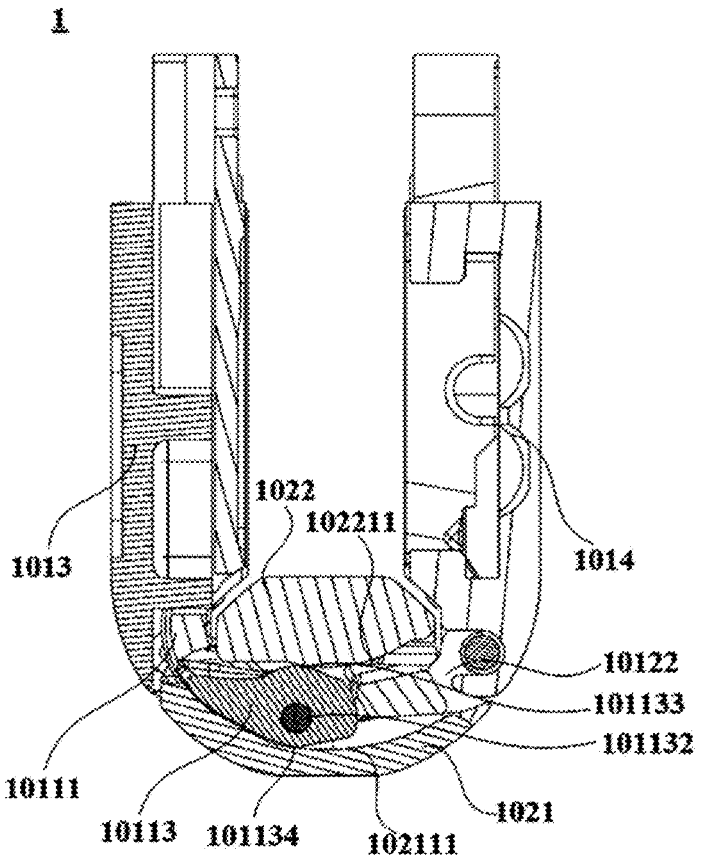
FIG. 9 is a sectional view of a first connector of a hinge mechanism when an electronic device is in a folded state according to an embodiment of this application.

FIG. 9 is a sectional view of the first connector 10113 of the hinge mechanism 1 when the electronic device is in the folded state according to an embodiment of this application. Refer to FIG. 5 and FIG. 9 together. In the process in which the electronic device changes from the unfolded state to the folded state, the first connector 10113 is capable of moving toward the first swing arm 10111 in the first track slot 1023. In the process in which the electronic device changes from the folded state to the unfolded state, the first connector 10113 is capable of moving toward the first support arm 10112 in the first track slot 1023. In this way, the first connector 10113 is capable of moving relative to the main shaft 102 according to a specified track.

Refer to FIG. 5 and FIG. 9 together. It can be seen that, in the process in which the electronic device changes from the unfolded state to the folded state or from the folded state to the unfolded state, the first swing arm 10011 and the first support arm 10112 can rotate around the main shaft 102. In addition, because the first swing arm 10111 and the first support arm 10112 perform mutual pulling movement via the first connector 10113, the first connector 10113 can further rotate relative to the surface 102211 of the first protrusion and the slot surface 102111 of the first arc-shaped slot in a process in which the first connector 10113 moves in the first track slot 1023, to improve smoothness of movement of the first rotating assembly 1011.

Figure 10:
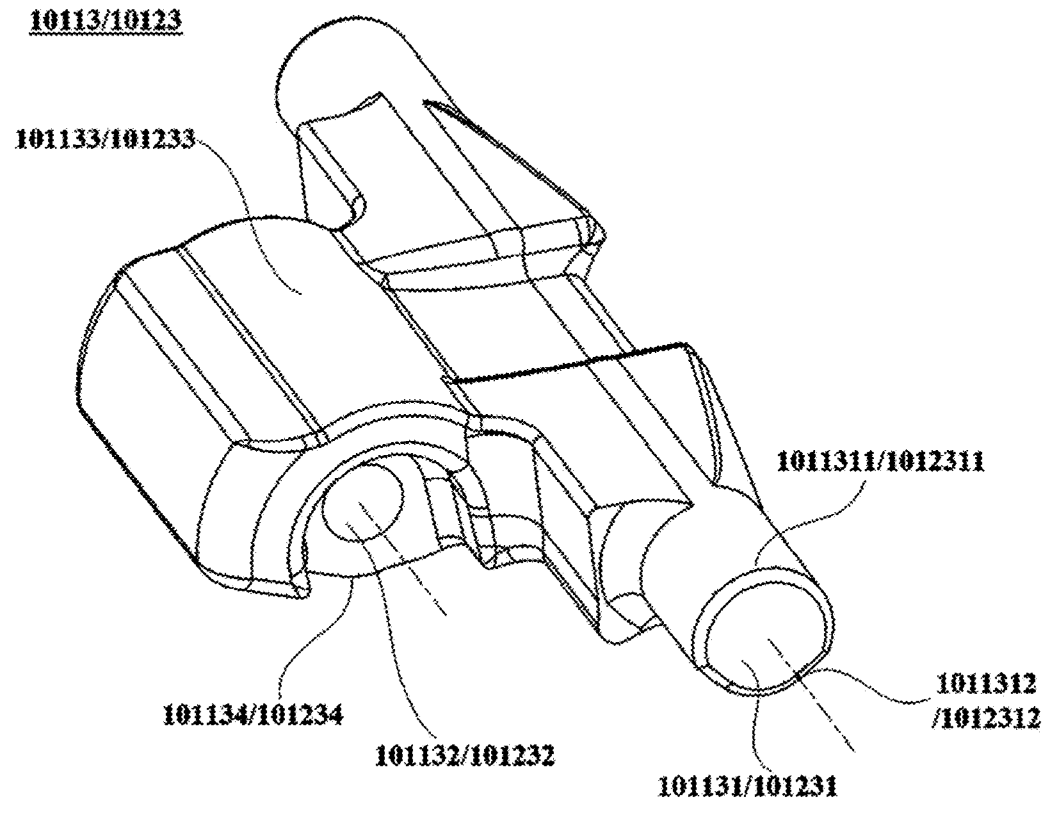
FIG. 10 is a diagram of a structure of a first connector according to an embodiment of this application.

FIG. 10 is a diagram of a structure of the first connector 10113 according to an embodiment of this application. In this application, the first connector 10113 may include a first arc-shaped surface 101133 and a second arc-shaped surface 101134. To implement rotation of the first connector 10113 relative to the surface 102211 of the first protrusion and the slot surface 102111 of the first arc-shaped slot, the first arc-shaped surface 101133 and the second arc-shaped surface 101134 may be circular arc surfaces, and a center of the first arc-shaped surface 101133 coincides with a center of the second arc-shaped surface 101134. Radii of the first arc-shaped surface 101133 and the second arc-shaped surface 101134 may be equal or unequal, which is not limited in this application. In addition, considering design tolerance, the first arc-shaped surface 101133 and the second arc-shaped surface 101134 may also be are surfaces of other possible forms such as an elliptical are surface, provided that the first connector 10113 can rotate relative to the surface 102211 of the first protrusion and the slot surface 102111 of the first arc-shaped slot.

Still refer to FIG. 5 and FIG. 9. When the electronic device is in the unfolded state shown in FIG. 5 and the folded state shown in FIG. 9, the first arc-shaped surface 101133 of the first connector 10113 may abut against the surface 102211 of the first protrusion, and the second arc-shaped surface 101134 abuts against the slot surface 102111 of the first arc-shaped slot. In this way, the surface 102211 of the first protrusion and the slot surface 102111 of the first arc-shaped slot limit the first connector 10113 to the first track slot 1023, so that when the hinge mechanism 1 is in the unfolded state and the folded state, the first connector 10113 is relatively stable without any gap-caused shake, and reliability of the hinge mechanism 1 is improved in the foregoing two states.

In this application, when the electronic device is in the unfolded state shown in FIG. 5, a distance between a point at which the surface 102211 of the first protrusion abuts against the first arc-shaped surface 101133 and a point at which the slot surface 102111 of the first arc-shaped slot abuts against the second arc-shaped surface 101134 may be denoted as d1. When the electronic device is in the folded state shown in FIG. 9, a distance between a point at which the surface 102211 of the first protrusion abuts against the first arc-shaped surface 101133 and a point at which the slot surface 102111 of the first arc-shaped slot abuts against the second arc-shaped surface 101134 is denoted as d2. When the electronic device is in the unfolded state and the folded state, the first arc-shaped surface 101133 of the first connector 10113 may abut against the surface 102211 of the first protrusion, and the second arc-shaped surface 101134 abuts against the slot surface 102111 of the first arc-shaped slot. Therefore, when both the first arc-shaped surface 101133 and the second arc-shaped surface 101134 are circular are surfaces, d1=d2 may be obtained.

In this application, specific disposing forms of the surface 102211 of the first protrusion and the slot surface 102111 of the first arc-shaped slot are not limited. For example, the surface 102211 of the first protrusion may be a circular are surface, and the slot surface 102111 of the first arc-shaped slot may be a circular are surface. In addition, a circle center of the surface 102211 of the first protrusion coincides with a circle center of the slot surface 102111 of the first arc-shaped slot. In some other possible embodiments of this application, both the surface 102211 of the first protrusion and the slot surface 102111 of the first arc-shaped slot may be configured as planes, so that the first track slot 1023 is a straight line slot. Alternatively, both the surface 102211 of the first protrusion and the slot surface 102111 of the first arc-shaped slot may be curved surfaces in other forms, so that the first track slot 1023 is a curved slot in any form, which should be understood as falling within the protection scope of this application.

Still refer to FIG. 5. In this application, the surface 102211 of the first protrusion may be equidistant from the slot surface 102111 of the first arc-shaped slot, and in this case, the first track slot 1023 is an equal-width slot. In the processes in which the electronic device changes from the unfolded state to the folded state and from the folded state to the unfolded state, the surface 102211 of the first protrusion keeps an abut-against state with the first arc-shaped surface 101133, and the slot surface 102111 of the first arc-shaped slot keeps an abut-against state with the second arc-shaped surface 101134. Therefore, in the processes in which the electronic device changes from the unfolded state to the folded state and from the folded state to the unfolded state, movement tracks of the first connector 10113 may be the same. This can help improve movement stability of the first connector 10113, to improve movement stability of the first rotating assembly 1011.

Figure 11:
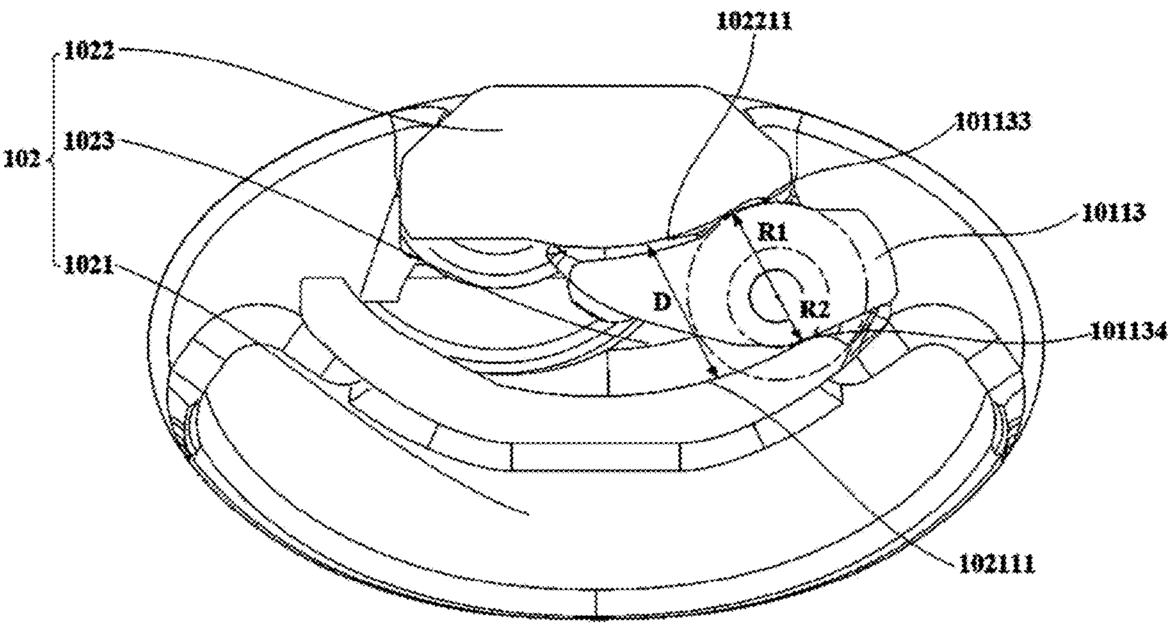
FIG. 11 is a diagram of an assembly structure of a first connector and a main shaft according to an embodiment of this application.

FIG. 11 is a diagram of an assembly structure of the first connector 10113 and the main shaft 102 according to an embodiment of this application. In this application, when the first track slot 1023 is an equal-width slot, and the first arc-shaped surface 101133 and the second arc-shaped surface 101134 are circular are surfaces, a sum of a radius R1 of the first arc-shaped surface 101133 and a radius R1 of the second arc-shaped surface 101134 is equal to a spacing D between the surface 102211 of the first protrusion and the slot surface 102111 of the first arc-shaped slot. In addition, in consideration of smoothness of movement of the first connector 10113 in the first track slot 1023, a specific design gap may be reserved between the first arc-shaped surface 101133 and the surface 102211 of the first protrusion, and/or between the second arc-shaped surface 101134 and the slot surface 102111 of the first arc-shaped slot.

In some other possible embodiments of this application, a movement track of the first connector 10113 in the process in which the electronic device changes from the unfolded state to the folded state may be different from a movement track of the first connector 10113 in the process in which the electronic device changes from the folded state to the unfolded state. During specific implementation, in the process in which the electronic device changes from the unfolded state to the folded state, the first arc-shaped surface 101133 abuts against the surface 102211 of the first protrusion, and there is a gap between the second arc-shaped surface 101134 and the slot surface 102111 of the first arc-shaped slot. In addition, in the process in which the electronic device changes from the unfolded state to the folded state, the second arc-shaped surface 101134 abuts against the slot surface 102111 of the first arc-shaped slot, and there is a gap between the first arc-shaped surface 101133 and the surface 102211 of the first protrusion. In this embodiment, the surface 102211 of the first protrusion may be non-equidistant from the slot surface 102111 of the first arc-shaped slot, and in this case, the first track slot 1023 may be a non-equal-width slot.

It can be learned from the foregoing descriptions that, in this application, the first swing arm 10111 may be rotatably connected to the main shaft 102, and the first swing arm 10111 may be rotatably connected to the main shaft 102 in a virtual shaft manner. This can help reduce space occupied by the first swing arm 10111 on the main shaft 102, to help reduce a volume of the rotating module 101, and implement a compact design for the hinge mechanism 1. In addition, it may be understood that, for the outward folding electronic device, when the first swing arm 10111 is rotatably connected to the main shaft 102 in a virtual shaft manner, an axis center at which the first swing arm 10111 rotates around the main shaft 102 is located on one side that is of the main shaft 102 and that is away from the flexible display.

Figure 12:
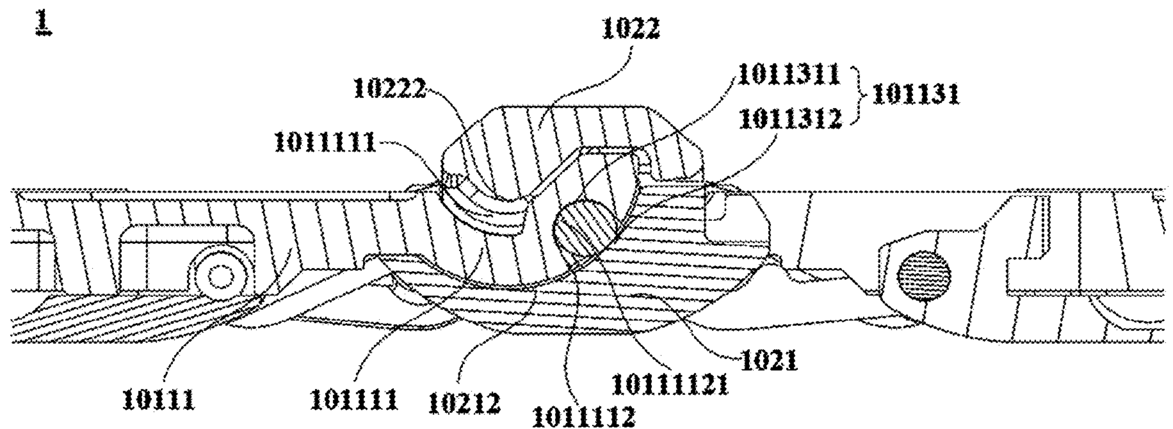
FIG. 12 is an A-A sectional view of the structure shown in FIG. 3.

It should be noted that, in this application, the virtual shaft is an axis center of a circular-arc-shaped structure. Two components that are rotatably connected can rotate relative to the virtual shaft, and a position of the virtual shaft is fixed as the two components that are rotatably connected rotate relative to each other. For example, FIG. 12 is an A-A sectional view of the structure shown in FIG. 3. A first arc-shaped rotating block 101111 may be disposed at an end that is of the first swing arm 10111 and that faces the base 1021. In addition, refer to FIG. 7. The base 1021 may be provided with a second arc-shaped slot 10212. The first arc-shaped rotating block 101111 may be accommodated in the second arc-shaped slot 10212, and the first arc-shaped rotating block 101111 is capable of sliding along the slot surface of the second arc-shaped slot 10212. In this way, the rotation of the first swing arm 10111 around the main shaft 102 is implemented through sliding of the first arc-shaped rotating block 101111 along an arc-shaped surface of the second arc-shaped slot 10212. In addition, in this application, the first arc-shaped rotating block 101111 may be but is not limited to a circular-arc-shaped rotating block, and the second arc-shaped slot 10212 may be but is not limited to a circular-arc-shaped slot. It may be understood that, when the first arc-shaped rotating block 101111 is a circular-arc-shaped rotating block, a surface that is of the first arc-shaped rotating block 101111 and that is in contact with the slot surface of the second arc-shaped slot 10212 may be a circular are surface, the slot surface of the second arc-shaped slot 10212 is also a circular are surface, and centers of the two circular are surfaces coincide with each other.

Refer to FIG. 8 and FIG. 12 together. The cover 1022 may include a second protrusion 10222 disposed toward the second arc-shaped slot 10212, at least a part of the first arc-shaped rotating block 101111 is located between the second protrusion 10222 and the second arc-shaped slot 10212, and the first arc-shaped rotating block 101111 may be in contact with a surface 102221 of the second protrusion. In this way, the first arc-shaped rotating block 101111 may be limited between the cover 1022 and the base 1021, and rotation stability of the first arc-shaped rotating block 101111 relative to the base 1021 can be effectively improved.

It should be noted that when the slot surface of the second arc-shaped slot 10212 is a circular are surface, a part that is of the surface 102221 of the second protrusion and that is in contact with the first arc-shaped rotating block 101111 may also be a circular are surface, and centers of the two circular are surfaces coincide with each other. In addition, a surface that is of the first arc-shaped rotating block 101111 and that faces the second protrusion 10222 may be a plane or a circular are surface, provided that the first arc-shaped rotating block 101111 can rotate relative to the second protrusion 10222.

Figure 13:
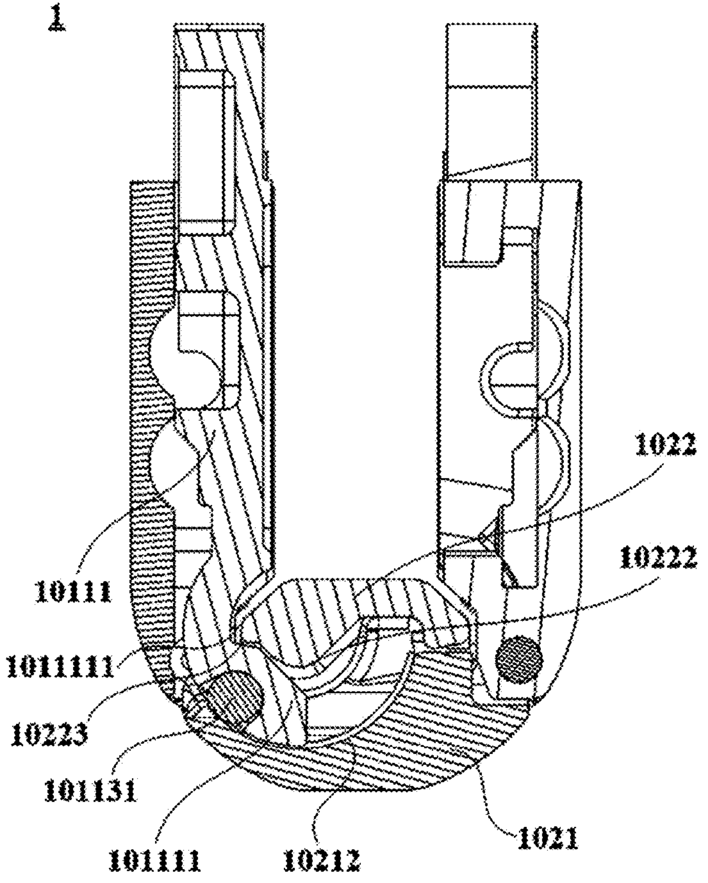
FIG. 13 is a sectional view of a first swing arm of a hinge mechanism when an electronic device is in a folded state according to an embodiment of this application.

FIG. 13 is a sectional view of the first swing arm 10111 of the hinge mechanism 1 when the electronic device is in the folded state according to an embodiment of this application. In this application, the first arc-shaped rotating block 101111 may further be provided with a first recess 1011111, and an opening of the first recess 1011111 is disposed toward the cover 1022. In addition, a first insertion part 10223 may be disposed at an end part that is of the cover 1022 and that faces the first swing arm 10111. In this case, in the folded state, the first insertion part 10223 may be inserted into the first recess 1011111, and a surface that is of the first insertion part 10223 and that faces the second arc-shaped slot 10212 abuts against at least a part of a surface of the first recess 1011111. In this way, a rotation part of the first arc-shaped rotating block 101111 may be limited, and the first arc-shaped rotating block 101111 may be prevented from falling off from the second arc-shaped slot 10212, to improve reliability of a connection between the first swing arm 10111 and the base 1021, and improve structural reliability of the entire hinge mechanism 1.

It should be noted that, in this application, in addition to being rotatably connected to the main shaft 102 in a virtual shaft manner, the first swing arm 10111 may be rotatably connected to the main shaft 102 in a solid shaft manner, so that the first swing arm 10111 can be connected to the main shaft 102 relatively reliably. It may be understood that, when the first swing arm 10111 is connected to the main shaft 102 in a solid shaft manner, an axis center at which the first swing arm 10111 rotates around the main shaft 102 is also located on one side that is of the main shaft 102 and that is away from the flexible display.

In this application, when the first swing arm 10111 is rotatably connected to the first connector 10113, still refer to FIG. 10. The first connector 10113 may include a first rotating shaft 101131 and a second rotating shaft 101132, and an axis of the first rotating shaft 101131 is parallel to and does not coincide with an axis of the second rotating shaft 101132.

Figure 14:
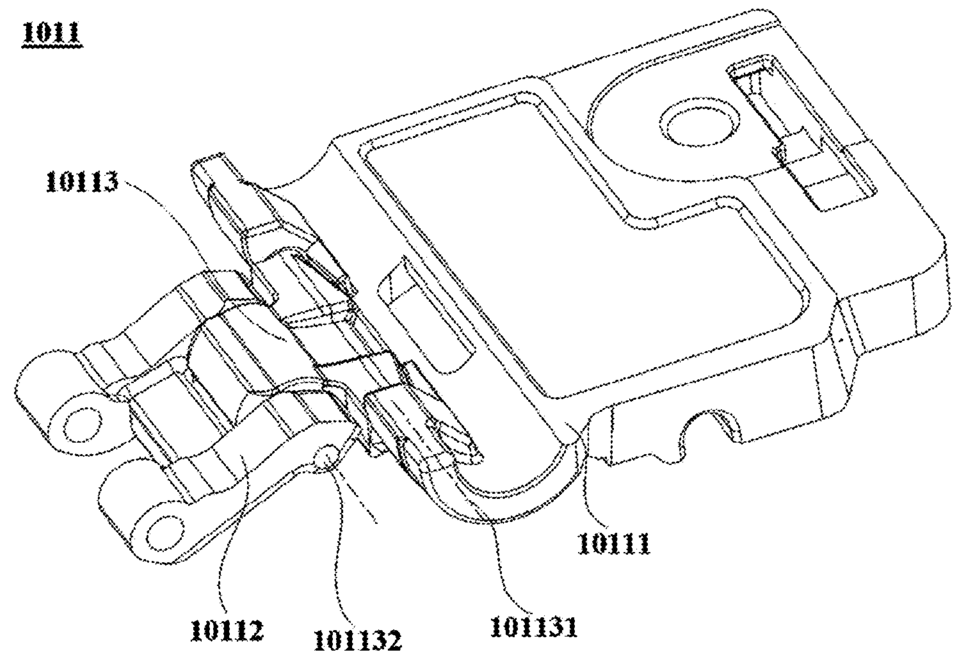
FIG. 14 is a diagram of a structure of a first rotating assembly according to an embodiment of this application.

In addition, FIG. 14 is a diagram of a structure of the first rotating assembly 1011 according to an embodiment of this application. The first connector 10113 is rotatably connected to the first swing arm 10111 via the first rotating shaft 101131, and the first connector 10113 is rotatably connected to the first support arm 10112 via the second rotating shaft 101132. In this way, the first swing arm 10111 and the first support arm 10112 may perform mutual pulling movement via the first connector 10113.

Figure 15:
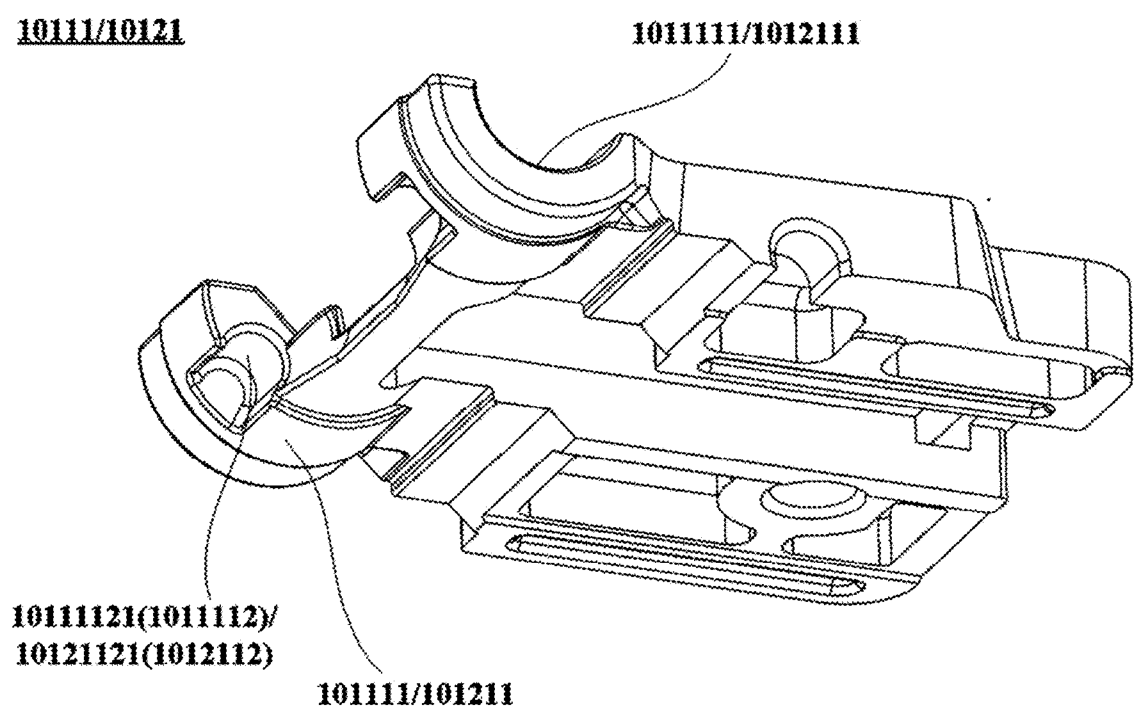
FIG. 15 is a diagram of a structure of a first swing arm according to an embodiment of this application.

FIG. 15 is a diagram of a structure of the first swing arm 10111 according to an embodiment of this application. The first arc-shaped rotating block 101111 of the first swing arm 10111 is provided with a first mounting slot 1011112. Refer to FIG. 12 and FIG. 15 together. A slot opening of the first mounting slot 1011112 is disposed toward the second arc-shaped slot 10212, and the first rotating shaft 101131 may be mounted in the first mounting slot 1011112. A part of a surface of the first rotating shaft 101131 may be in contact with a slot surface of the first mounting slot 1011112, and a part of the surface of the first rotating shaft 101131 is in contact with the slot surface of the second arc-shaped slot 10212, to limit the first rotating shaft 101131 to the first mounting slot 1011112.

Still refer to FIG. 12 and FIG. 15. The slot surface of the first mounting slot 1011112 may include a first circular are surface 10111121, the surface that is of the first rotating shaft 101131 and that is in contact with the slot surface of the first mounting slot 1011112 is a second circular are surface 1011311, and a center of the first circular are surface 10111121 coincides with a center of the second circular are surface 1011311. In addition, refer to FIG. 7. The slot surface of the second arc-shaped slot 10212 may be a third circular are surface 102121. However, as shown in FIG. 12, the surface that is of the first rotating shaft 101131 and that is in contact with the slot surface of the second arc-shaped slot 10212 may be a fourth circular are surface 1011312, and a center of the third circular are surface 102121 coincides with a center of the fourth circular are surface 1011312. In this way, refer to FIG. 12 and FIG. 13 together. When the first rotating shaft 101131 slides along the slot surface of the second arc-shaped slot 10212 with the first arc-shaped rotating block 101111, the first rotating shaft 101131 may further rotate relative to the first arc-shaped rotating block 101111, to help implement movement of the first connector 10113 relative to the main shaft 102.

In this application, when the first connector 10113 is rotatably connected to the first support arm 10112, as shown in FIG. 14, the second rotating shaft 101132 may penetrate both the first connector 10113 and the first support arm 10112. In this case, a connection manner of the first connector 10113 and the first support arm 10112 is relatively simple, which helps simplify a structure of the first rotating assembly 1011, so that a structure of the hinge mechanism 1 can be simplified. It should be noted that, when both the first arc-shaped surface 101133 and the second arc-shaped surface 101134 of the first connector 10113 are circular are surfaces, the center of the first arc-shaped surface 101133, the center of the second arc-shaped surface 101134, and an axis center of the second rotating shaft 101132 coincide with each other.

It may be understood that, in the hinge mechanism 1 provided in embodiments of this application, the first connector 10113 may include a plurality of first sub-connectors that are sequentially rotatably connected. In addition, the plurality of first sub-connectors may be located between the first swing arm 10111 and the first support arm 10112, the first swing arm 10111 may be rotatably connected to a first sub-connector adjacent to the first swing arm 10111, and the first support arm 10112 may be rotatably connected to a first sub-connector adjacent to the first support arm 10112. For a manner in which the first swing arm 10111 is rotatably connected to the first sub-connector adjacent to the first swing arm 1011 and a manner in which the first support arm 10112 is rotatably connected to the first sub-connector adjacent to the first support arm 10112, refer to the foregoing descriptions of the rotatable connection of the first swing arm 10111 and the first support arm 10112 to the first connector 10113. Details are not described herein again. In this application, the first connector 10113 is set as the plurality of first sub-connectors that are sequentially rotatably connected, so that the first swing arm 10111 and the first support arm 10112 are connected via the plurality of first sub-connectors. This can effectively improve speed uniformity in a process in which the first swing arm 10111 and the first support arm 10112 rotate around the main shaft 102, thereby improving smoothness of mutual pulling movement of the first swing arm 10111 and the first support arm 10112.

Still refer to FIG. 4. In this application, the rotating module 101 may further include a first housing mounting bracket 1013 and a second housing mounting bracket 1014. The first housing mounting bracket 1013 and the second housing mounting bracket 1014 are respectively disposed on two opposite sides of the main shaft 102, and the first rotating assembly 1011 is located between the first housing mounting bracket 1013 and the second housing mounting bracket 1014. The first swing arm 10111 is slidably connected to the first housing mounting bracket 1013. During specific implementation, the first housing mounting bracket 1013 is provided with a first sliding groove 10131. The first sliding groove 10131 extends along a first direction, and the first swing arm 10111 may be mounted in the first sliding groove 10131 and is capable of sliding along the first direction in the first sliding groove 10131. The first direction may be a direction along which the first housing mounting bracket 1013 moves toward or away from the base 1021. In addition, to prevent the first swing arm 10111 from falling off from the first sliding groove 10131, a first sliding rail may be disposed on a sliding groove wall of the first sliding groove 10131, and a first sliding block may be disposed on the first swing arm 10111. In this way, the first sliding block may be clamped on the first sliding rail, and the first sliding block is capable of sliding along the first sliding rail, to limit the first swing arm 10111 to the first sliding groove 10131. In addition, the first sliding rail is disposed on the sliding groove wall of the first sliding groove 10131, which may provide guidance for sliding of the first swing arm 10111 along the first sliding groove 10131, to improve movement stability of the first swing arm 10111.

In this application, the first support arm 10112 may be rotatably connected to the second housing mounting bracket 1014. During specific implementation, still refer to FIG. 4. The second housing mounting bracket 1014 is provided with a second mounting part 10142. An end part that is of the first support arm 10112 and that faces the second housing mounting bracket 1014 is mounted on the second mounting part 10142, and an end part that is of the first support arm 10112 and that faces the second housing mounting bracket 1014 is rotatably connected to the second mounting part 10142.

In embodiments of this application, a specific manner in which the end part that is of the first support arm 10112 and that faces the second housing mounting bracket 1014 is rotatably connected to the second mounting part 10142 is not limited. For example, still refer to FIG. 4. The second mounting part 10142 may be provided with a first mounting hole, and a second mounting hole is disposed at the end part that is of the first support arm 10112 and that faces the second housing mounting bracket 1014. In this case, an end part that is of the first support arm 10112 and that faces the first housing mounting bracket 1013 may be rotatably connected to the second mounting part 10142 via a rotating shaft that penetrates both the first mounting hole and the second mounting hole.

Figure 16:
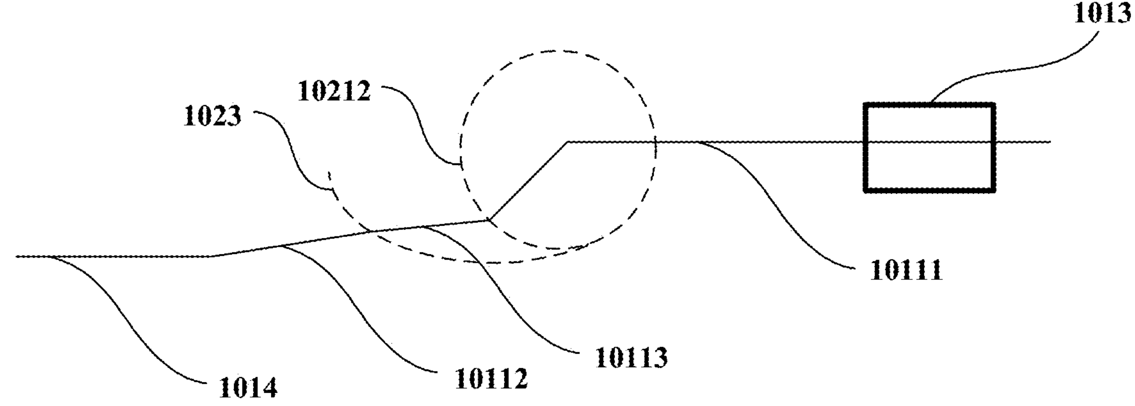
FIG. 16 is a diagram of a principle of a movement mechanism of a hinge mechanism according to an embodiment of this application.

FIG. 16 is a diagram of a principle of a movement mechanism of the hinge mechanism according to an embodiment of this application. Based on the hinge mechanism 1 provided in the foregoing embodiments of this application, in the process in which the electronic device changes from the unfolded state to the folded state, the first housing mounting bracket 1013 and the second housing mounting bracket 1014 move toward each other. When the first housing mounting bracket 1013 drives the first swing arm 10111 to rotate around the main shaft 102 clockwise, the first swing arm 10111 is capable of sliding along the slot surface of the second arc-shaped slot 10212, so that the first connector 10113 may be driven to move toward the first swing arm 10111 in the first track slot 1023 of the main shaft 102. In addition, because the first connector 10113 is rotatably connected to the first support arm 10112, in a process in which the first connector 10113 moves toward the first swing arm 10111 in the first track slot 1023 of the main shaft 102, the first support arm 10112 may be driven to rotate around the main shaft 102 counter-clockwise, so that the first support arm 10112 drives the second housing mounting bracket 1014 to rotate around the main shaft 102 counter-clockwise. In the process in which the electronic device changes from the folded state to the unfolded state, the first housing mounting bracket 1013 and the second housing mounting bracket 1014 move away from each other. When the first housing mounting bracket 1013 drives the first swing arm 10111 to rotate around the main shaft 102 counter-clockwise, the first swing arm 10111 may drive the first connector 10113 to move toward the first support arm 10112 in the first track slot 1023 of the main shaft 102, and the first support arm 10112 may be driven to rotate around the main shaft 102 clockwise, so that the first support arm 10112 drives the second housing mounting bracket 1014 to rotate around the main shaft 102 clockwise. In this way, folding and unfolding functions of the hinge mechanism 1 are implemented.

Some existing hinge mechanisms need to thicken a rotating assembly connected to a main shaft to ensure stability of the mechanisms. In this way, both the main shaft and the hinge mechanism are very heavy. If the main shaft and the hinge mechanism are forcibly thinned, strength of the rotating assembly is easily weakened, thereby greatly affecting reliability of the hinge mechanisms and shortening a life of the electronic device. The hinge mechanism 1 in this application has a simplified structure. According to the foregoing structural relationship, the first connector 10113 may be manufactured with a relatively small cross section to travel back and forth in the first track slot 1023 of the main shaft 102. In addition, the first connector 10113 has a sufficient length extension along a vertical axial direction, and separately has a connection relationship with the first swing arm 10111 and the first support arm 10112, so that reliability of the hinge mechanism 1 can be ensured. In this way, the thickness of the main shaft 102 and the thickness of the entire electronic device can be reduced, and reliability of the hinge mechanism 1 can be maintained, so that the entire hinge mechanism 1 is light, thin, and reliable.

In addition, because the first connector 10113 is capable of moving in the first track slot 1023 according to a specified track, uncontrolled movement of the first connector 10113 in an entire folding and unfolding process can be avoided, and random movement of the first housing mounting bracket 1013 and the second housing mounting bracket 1014 can further be avoided, to ensure structural stability and movement stability of the entire hinge mechanism 1. In some cases, the first track slot 1023 is appropriately designed, so that an outer tangent line of the hinge mechanism 1 can keep a constant length in the entire folding and unfolding process, and the flexible display covering the surface of the hinge mechanism 1 can also basically keep a length unchanged. In this way, squeezing or pulling on the flexible display can be effectively avoided, to improve structural reliability of the flexible display and further improve structural reliability of the electronic device.

Still refer to FIG. 4. Similarly structured as the first rotating assembly 1011, the second rotating assembly 1012 is set to be located between the first housing mounting bracket 1013 and the second housing mounting bracket 1014. In addition, the second rotating assembly 1012 may include a second swing arm 10121, a second support arm 10122, and a second connector 10123. The second connector 10123 is located between the second swing arm 10121 and the second support arm 10122, the second connector 10123 is rotatably connected to the second swing arm 10121, and the second connector 10123 is rotatably connected to the second support arm 10122. In this application, the second connector 10123 may be rotatably connected to the second swing arm 10121 and the first support arm 10112 with reference to how the first connector 10113 is rotatably connected to the second swing arm 10121 and the second support arm 10122. For example, refer to FIG. 10. FIG. 10 may also be used to indicate a structure of the second connector 10123 according to this embodiment of this application. The second connector 10123 may include a third rotating shaft 101231 and a fourth rotating shaft 101232, and an axis of the third rotating shaft 101231 is parallel to and does not coincide with an axis of the fourth rotating shaft 101232. The second connector 10123 may be rotatably connected to the second swing arm 10121 via the third rotating shaft 101231, and the second connector 10123 may be rotatably connected to the second support arm 10122 via the fourth rotating shaft 101232, so that the second swing arm 10121 and the second support arm 10122 perform mutual pulling movement via the second connector 10123.

In addition, refer to FIG. 6. The main shaft 102 may be provided with a second track slot 1024, and the second connector 10123 is capable of moving along the second track slot, for limitation on a movement track of the second connector 10123. In practice, refer to FIG. 7. The base 1021 may be provided with a third arc-shaped slot 10213, the second connector 10123 is accommodated in the third arc-shaped slot 10213, and the second connector 10123 is capable of sliding along a slot surface of the third arc-shaped slot 10213. In addition, refer to FIG. 8. The cover 1022 includes a third protrusion 10224. The third protrusion 10224 may be disposed toward the third arc-shaped slot 10213 of the base 1021 in FIG. 7. A gap exists between a surface 102241 of the third protrusion and the slot surface 102131 of the third arc-shaped slot, and the gap is used as the second track slot 1024.

In this application, as shown in FIG. 10, the second connector 10123 may include a third arc-shaped surface 101233 and a fourth arc-shaped surface 101234. When the electronic device is in the unfolded state and the folded state, the third arc-shaped surface 101233 of the second connector 10123 may abut against the surface 102241 of the third protrusion, and the fourth arc-shaped surface 101234 abuts against the slot surface 102131 of the third arc-shaped slot. In this way, the surface 102241 of the third protrusion and the slot surface 102131 of the third arc-shaped slot limit the second connector 10123 to the second track slot 1024, so that when the hinge mechanism 1 is in the unfolded state and the folded state, the second connector 10123 is relatively stable without any gap-caused shake, and structural reliability of the hinge mechanism 1 is improved in the foregoing two states.

In this embodiment of this application, the third arc-shaped surface 101233 of the second connector 10123 may be disposed with reference to the first arc-shaped surface 101133 of the first connector 10113, and the fourth arc-shaped surface 101234 may be disposed with reference to the second arc-shaped surface 101134 of the first connector 10113. Details are not described herein again. In addition, the second track slot 1024 may be set with reference to the first track slot 1023. Simply speaking, spacings between the surface 102241 of the third protrusion and the slot surface 102131 of the third arc-shaped slot are equal, so that the second track slot 1024 is an equal-width slot. In this case, in the processes in which the electronic device changes from the unfolded state to the folded state and from the folded state to the unfolded state, the surface 102241 of the third protrusion keeps an abut-against state with the third arc-shaped surface 101233, and the slot surface 102131 of the third arc-shaped slot keeps an abut-against state with the fourth arc-shaped surface 101234. Therefore, in the processes in which the electronic device changes from the unfolded state to the folded state and from the folded state to the unfolded state, movement tracks of the second connector 10123 in the second track slot 1024 are the same. Alternatively, in the process in which the electronic device changes from the unfolded state to the folded state, the third arc-shaped surface 101233 abuts against the surface 102241 of the third protrusion, and a gap exists between the fourth arc-shaped surface 101234 and the slot surface 102131 of the third arc-shaped slot. In the process in which the electronic device changes from the folded state to the unfolded state, the fourth arc-shaped surface 101234 abuts against the slot surface 102131 of the third arc-shaped slot, and a gap exists between the third arc-shaped surface 101233 and the surface 102241 of the third protrusion. In this way, a movement track of the second connector 10123 in the process in which the electronic device changes from the unfolded state to the folded state is different from a movement track of the second connector 10123 in the process in which the electronic device changes from the folded state to the unfolded state.

In this application, the second swing arm 10121 is rotatably connected to the main shaft 102. The second swing arm 10121 and the main shaft 102 may be rotatably connected in a virtual shaft manner. During specific implementation, as shown in FIG. 7, the base 1021 may be provided with a fourth arc-shaped slot 10214. In addition, refer to FIG. 4 and FIG. 15. FIG. 15 may also show a structure of the second swing arm 10121. A second arc-shaped rotating block 101211 is disposed at an end that is of the second swing arm 10121 and that faces the base 1021. The second arc-shaped rotating block 101211 may be but is not limited to a circular-arc-shaped rotating block, and the fourth arc-shaped slot 10214 may be but is not limited to a circular-arc-shaped slot. The second arc-shaped rotating block 101211 may be accommodated in the fourth arc-shaped slot 10214, and is capable of sliding along the slot surface of the fourth arc-shaped slot 10214. In this way, the rotation of the second swing arm 10121 around the base 1021 is implemented through sliding of the second arc-shaped rotating block 101211 along the slot surface of the fourth arc-shaped slot 10214. This can help reduce space occupied by the second swing arm 10121 on the main shaft 102, to help reduce a volume of the rotating module 101, and implement a compact design for the hinge mechanism 1. It may be understood that, for the outward folding electronic device, when the second swing arm 10121 is rotatably connected to the main shaft 102 in a virtual shaft manner, an axis center at which the second swing arm 10121 rotates around the main shaft 102 is located on one side that is of the hinge mechanism and that is away from the flexible display.

In addition, in this application, the second arc-shaped rotating block 101211 may be but is not limited to a circular-arc-shaped rotating block, and the fourth arc-shaped slot 10214 may be but is not limited to a circular-arc-shaped slot. It may be understood that, when the second arc-shaped rotating block 101211 is a circular-arc-shaped rotating block, a surface that is of the second arc-shaped rotating block 101211 and that is in contact with the slot surface of the fourth arc-shaped slot 10214 may be a circular are surface, the slot surface of the fourth arc-shaped slot 10214 is also a circular are surface, and centers of the two circular are surfaces coincide with each other.

In this application, to improve stability of rotation of the second swing arm 10121 around the main shaft 102, as shown in FIG. 8, the cover 1022 further includes a fourth protrusion 10225 disposed toward the fourth arc-shaped slot 10214, at least a part of the second arc-shaped rotating block 101211 is located between the fourth protrusion 10225 and the fourth arc-shaped slot 10214, and a surface that is of the second arc-shaped rotating block 101211 and that faces the fourth protrusion 10225 may be in contact with a surface 102251 of the fourth protrusion. In this way, the second arc-shaped rotating block 101211 may be limited between the cover 1022 and the base 1021, and rotation stability of the second arc-shaped rotating block 101211 relative to the base 1021 can be effectively improved. In addition, when the slot surface of the fourth arc-shaped slot 10214 is a circular are surface, a part that is of the surface 102251 of the fourth protrusion and that is in contact with the second arc-shaped rotating block 101211 may also be a circular are surface, and centers of the two circular are surfaces coincide with each other. In this application, a surface that is of the second arc-shaped rotating block 101211 and that faces the fourth protrusion 10225 may be a plane or a circular are surface, provided that the second arc-shaped rotating block 101211 can rotate relative to the fourth protrusion 10225 in a process in which the second arc-shaped rotating block 101211 slides along the slot surface of the fourth arc-shaped slot 10214.

To improve reliability of a connection between the second swing arm 10121 and the base 1021, the second arc-shaped rotating block 101211 may further be provided with a second recess 1012111, and an opening of the second recess 1012111 is disposed toward the cover 1022. In addition, a second insertion part may be disposed at an end part that is of the cover 1022 and that faces the second housing mounting bracket 1014. In this case, in the folded state, the second insertion part may be inserted into the second recess 1012111, and a surface that is of the second insertion part and that faces the fourth arc-shaped slot 10214 abuts against at least a part of a surface of the second recess 1012111. In this way, a rotation part of the second arc-shaped rotating block 101211 may be limited, and the second arc-shaped rotating block 101211 may be prevented from falling off from the fourth arc-shaped slot 10214.

It should be noted that, in this application, in addition to being rotatably connected to the main shaft 102 in a virtual shaft manner, the second swing arm 10121 may be rotatably connected to the main shaft 102 in a solid shaft manner, so that the first swing arm 10111 can be connected to the main shaft 102 relatively reliably. For the outward folding electronic device, when the second swing arm 10121 is rotatably connected to the main shaft 102 in a solid shaft manner, an axis center at which the second swing arm 10121 rotates around the main shaft 102 is also located on one side that is of the hinge mechanism and that is away from the flexible display.

Specifically, when the second connector 10123 is rotatably connected to the second swing arm 10121 via the third rotating shaft 101231, still refer to FIG. 15. The second arc-shaped rotating block 101211 is provided with a second mounting slot 1012112, and a slot opening of the second mounting slot 1012112 is disposed toward the fourth arc-shaped slot 10214. In this case, the third rotating shaft 101231 may be mounted in the second mounting slot 1012112, a part of the surface of the third rotating shaft 101231 may be in contact with a slot surface of the second mounting slot 1012112, and a part of the surface of the third rotating shaft 101231 is in contact with the slot surface of the fourth arc-shaped slot 10214, to limit the third rotating shaft 101231 to the second mounting slot 1012112.

As shown in FIG. 15, in this application, the slot surface of the second mounting slot 1012112 may include a fifth circular are surface 10121121. As shown in FIG. 10, the surface that is of the third rotating shaft 101231 and that is in contact with the slot surface of the second mounting slot 1012112 is a sixth circular are surface 1012311, and a center of the fifth circular are surface 10121121 coincides with a center of the sixth circular are surface 1012311. In addition, the slot surface of the fourth arc-shaped slot 10214 is a seventh circular are surface 102141, the surface that is of the third rotating shaft 101231 and that is in contact with the slot surface of the fourth arc-shaped slot 10214 may be an eighth circular are surface 1012312, and a center of the seventh circular are surface 102141 coincides with a center of the eighth circular are surface 1012312. In this way, when the third rotating shaft 101231 slides along the slot surface of the fourth arc-shaped slot 10214 with the second arc-shaped rotating block 101211, the third rotating shaft 101231 may further rotate relative to the second arc-shaped rotating block 101211, to help implement movement of the second connector 10123 relative to the main shaft 102.

In embodiments of this application, specifically, when the second connector 10123 is rotatably connected to the second support arm 10122 via the fourth rotating shaft 101232, the fourth rotating shaft 101232 may penetrate the second connector 10123 and the second support arm 10122 at the same time. In this case, a connection manner of the second connector 10123 and the second support arm 10122 is relatively simple, which helps simplify a structure of the second rotating assembly 1012, so that a structure of the hinge mechanism 1 can be simplified.

It may be understood that, in the hinge mechanism 1 provided in embodiments of this application, the second connector 10123 may include a plurality of second sub-connectors that are sequentially rotatably connected. In addition, the plurality of second sub-connectors may be located between the second swing arm 10121 and the second support arm 10122. In this case, the second swing arm 10121 may be rotatably connected to an adjacent second sub-connector, and the second support arm 10122 may be rotatably connected to an adjacent second sub-connector. For a manner in which the second swing arm 10121 is rotatably connected to the adjacent second sub-connector and a manner in which the second support arm 10122 is rotatably connected to the adjacent second sub-connector, refer to the foregoing descriptions of the rotatable connection of the second swing arm 10121 and the second support arm 10122 to the second connector 10123. Details are not described herein again. In this application, the second connector 10123 is set as the plurality of second sub-connectors that are sequentially rotatably connected, so that the second swing arm 10121 and the second support arm 10122 are rotatably connected via the plurality of second sub-connectors. This can effectively improve speed uniformity in a process in which the second swing arm 10121 and the second support arm 10122 rotate around the main shaft 102, thereby improving smoothness of mutual pulling movement of the second swing arm 10121 and the second support arm 10122.

In this application, the second swing arm 10121 may be slidably connected to the second housing mounting bracket 1014. During specific implementation, the second housing mounting bracket 1014 is provided with a second sliding groove 10141. The second sliding groove 10141 and the second mounting part 10142 are disposed at a spacing along the length direction of the hinge mechanism 1. The second sliding groove 10141 extends along a second direction, and the second swing arm 10121 may be mounted in the second sliding groove 10141 and is capable of sliding along the second direction in the second sliding groove 10141. The second direction may be a direction along which the second housing mounting bracket 1014 moves toward or away from the base 1021. In addition, to prevent the second swing arm 10121 from falling off from the second sliding groove 10141, a second sliding rail may be disposed on a sliding groove wall of the second sliding groove 10141, and a second sliding block may be disposed on the second swing arm 10121. In this way, the second sliding block may be clamped on the second sliding rail, and the second sliding block is capable of sliding along the second sliding rail, to limit the second swing arm 10121 to the second sliding groove 10141. In addition, the second sliding rail is disposed on the sliding groove wall of the second sliding groove 10141, which may provide guidance for sliding of the second swing arm 10121 along the second sliding groove 10141, to improve movement stability of the second swing arm 10121.

In addition, the second support arm 10122 may be rotatably connected to the first housing mounting bracket 1013. During specific implementation, the first housing mounting bracket 1013 is provided with a first mounting part 10132. Along the length direction of the hinge mechanism 1, the first mounting part 10132 and the first sliding groove 10131 are disposed at a spacing. An end part that is of the second support arm 10122 and that faces the first housing mounting bracket 1013 is mounted on the first mounting part 10132, and an end part that is of the second support arm 10122 and that faces the first housing mounting bracket 1013 is rotatably connected to the first mounting part 10132.

In embodiments of this application, a specific manner in which the end part that is of the second support arm 10122 and that faces the first housing mounting bracket 1013 is rotatably connected to the first mounting part 10132 is not limited. For example, still refer to FIG. 4. The first mounting part 10132 may be provided with a third mounting hole, and a fourth mounting hole is disposed at an end part that is of the second support arm 10122 and that faces the first housing mounting bracket 1013. In this case, the end part that is of the second support arm 10122 and that faces the first housing mounting bracket 1013 may be rotatably connected to the first mounting part 10132 via a rotating shaft that penetrates both the third mounting hole and the fourth mounting hole.

Based on the hinge mechanism 1 provided in the foregoing embodiments of this application, in the process in which the electronic device changes from the unfolded state to the folded state, the first housing mounting bracket 1013 and the second housing mounting bracket 1014 move toward each other. When the second housing mounting bracket 1014 drives the second swing arm 10121 to rotate around the main shaft 102 counter-clockwise, the second swing arm 10121 may drive the second connector 10123 to move toward the second swing arm 10121 in the second track slot 1024 of the main shaft 102. In addition, because the second connector 10123 is rotatably connected to the second support arm 10122, in the process in which the second connector 10123 moves toward the second swing arm 10121 in the second track slot 1024 of the main shaft 102, the second support arm 10122 may be driven to rotate around the main shaft 102 clockwise, so that the second support arm 10122 drives the first housing mounting bracket 1013 to rotate around the main shaft 102 clockwise. In the process in which the electronic device changes from the folded state to the unfolded state, the first housing mounting bracket 1013 and the second housing mounting bracket 1014 move away from each other. When the second housing mounting bracket 1014 drives the second swing arm 10121 to rotate around the main shaft 102 clockwise, the second swing arm 10121 may drive the second connector 10123 to move toward the second support arm 10122 in the second track slot 1024 of the main shaft 102, and the second support arm 10122 may be driven to rotate around the main shaft 102 counter-clockwise, so that the second support arm 10122 drives the first housing mounting bracket 1013 to rotate around the main shaft 102 counter-clockwise. In this way, folding and unfolding functions of the hinge mechanism 1 are implemented.

Some existing hinge mechanisms need to thicken a rotating assembly connected to a main shaft to ensure stability of the mechanisms. In this way, both the main shaft and the hinge mechanism are very heavy. If the main shaft and the hinge mechanism are forcibly thinned, strength of the rotating assembly is easily weakened, thereby greatly affecting reliability of the hinge mechanisms and shortening a life of the electronic device. The hinge mechanism 1 in this application has a simplified structure. According to the foregoing structural relationship, the second connector 10123 may be manufactured with a relatively small cross section to travel back and forth in the second track slot 1024 of the main shaft 102. In addition, the second connector 10123 has a sufficient length extension along a vertical axial direction, and separately has a connection relationship with the second swing arm 10121 and the second support arm 10122, so that reliability of the hinge mechanism 1 can be ensured. In this way, the thickness of the main shaft 102 and the thickness of the entire electronic device can be reduced, and reliability of the hinge mechanism 1 can be maintained, so that the entire hinge mechanism 1 is light, thin, and reliable.

Because the second connector 10123 is capable of moving according to a specified track, uncontrolled movement of the second connector 10123 in an entire folding and unfolding process can be avoided, and random movement of the first housing mounting bracket 1013 and the second housing mounting bracket 1014 can further be avoided, to ensure structural stability and movement stability of the entire hinge mechanism 1. In some cases, the second track slot 1024 is appropriately designed, so that an outer tangent line of the hinge mechanism 1 can keep a constant length in the entire folding and unfolding process, and the flexible display covering the surface of the hinge mechanism 1 can also basically keep a length unchanged. In this way, squeezing or pulling on the flexible display can be effectively avoided, to improve structural reliability of the flexible display and further improve structural reliability of the electronic device.

Figure 17:
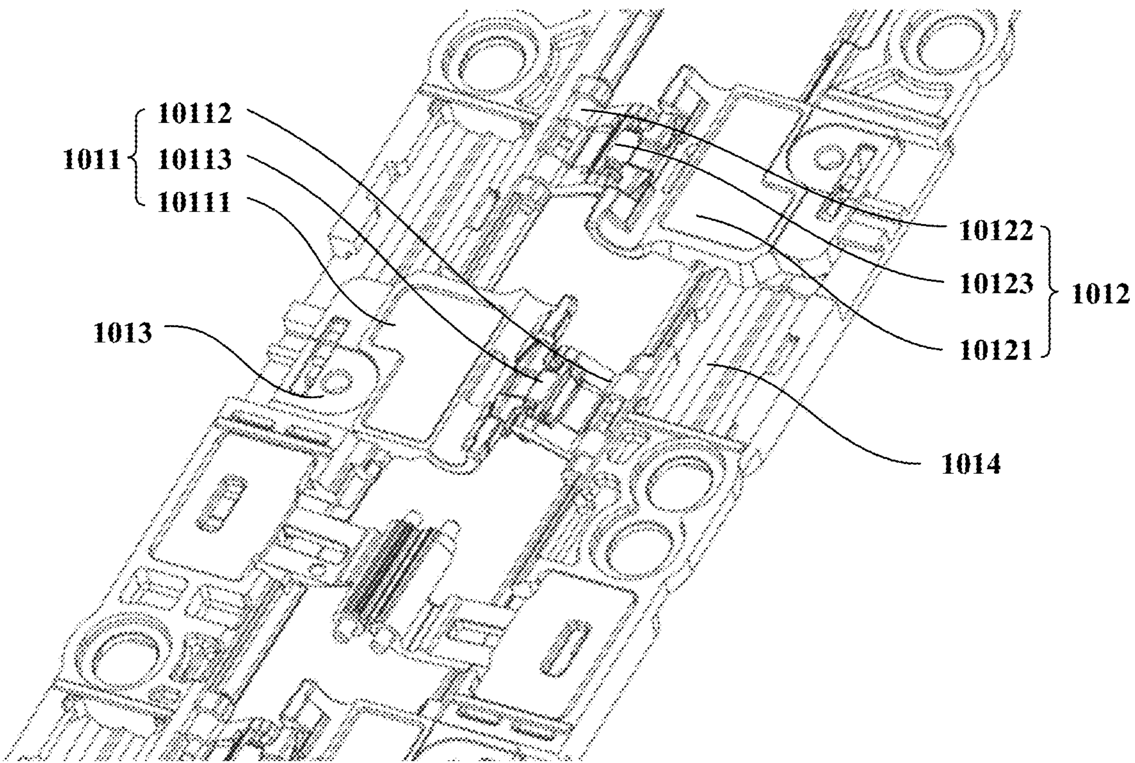
FIG. 17 is a diagram of a partial structure of a hinge mechanism according to an embodiment of this application.

FIG. 17 is a diagram of a partial structure of the hinge mechanism 1 according to an embodiment of this application. The main shaft 102 is omitted in FIG. 17, to help describe a mutual pulling movement relationship between the first rotating assembly 1011 and the second rotating assembly 1012. In this application, the first swing arm 10111 is slidably connected to the first housing mounting bracket 1013, the first support arm 10112 is rotatably connected to the second housing mounting bracket 1014, and the first swing arm 10111 may pull, via the first connector 10113, the first support arm 10112 to move according to a specified track; and the second swing arm 10121 is slidably connected to the second housing mounting bracket 1014, the second support arm 10122 is rotatably connected to the first housing mounting bracket 1013, and the second swing arm 10121 may pull, via the second connector 10123, the second support arm 10122 to move according to a specified track. This can limit movement distances of the first housing mounting bracket 1013 and the second housing mounting bracket 1014 toward or away from the main shaft 102, so that when the electronic device is in any folding state, a distance between the first housing mounting bracket 1013 and the main shaft 102 is equal to a distance between the second housing mounting bracket 1014 and the main shaft 102. In addition, in the processes in which the electronic device changes from the unfolded state to the folded state and from the folded state to the unfolded state, the first housing mounting bracket 1013 is capable of moving at an equal distance relative to the main shaft 102, and the second housing mounting bracket 1014 is capable of moving at an equal distance relative to the main shaft 102. In this way, when the hinge mechanism 1 may be used in the electronic device shown in FIG. 2*b*, an extension length of a support surface formed by the first housing 2, the second housing 3, and the hinge mechanism 1 in the unfolded state can adapt to a flattening length of the flexible display, and when the electronic device is in the folded state, a folding requirement of the foldable part of the flexible display can be met, so that deformation of the flexible display can be avoided, and squeezing or pulling stress on the flexible display can be reduced, to prolong a service life of the flexible display and improve reliability of the electronic device.

Figure 18:
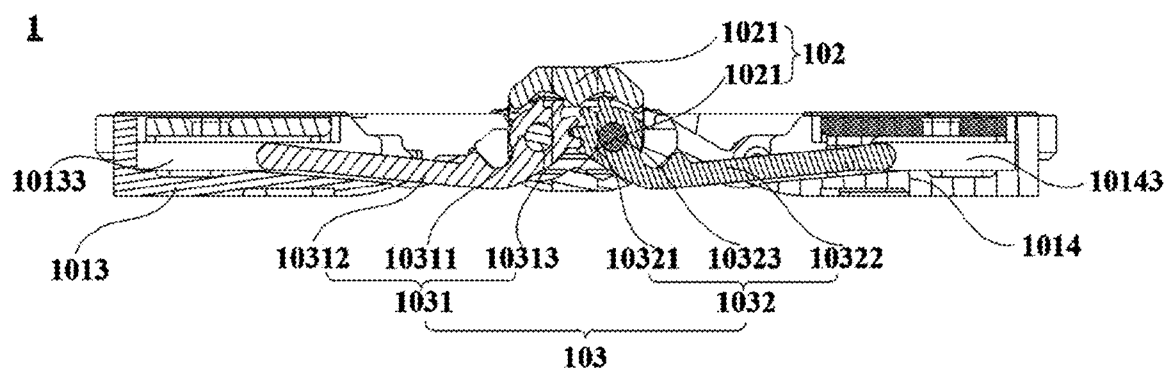
FIG. 18 is a sectional view of a synchronization assembly of a hinge mechanism when an electronic device is in an unfolded state according to an embodiment of this application.

It may be understood that, in the unfolding and folding processes of the electronic device, the first housing 2 and the second housing 3 move synchronously, so that a risk of instantaneous squeezing or pulling stress on the flexible display can be effectively reduced. In view of this, the hinge mechanism 1 provided in embodiments of this application may further include a synchronization assembly 103. In practice, refer to FIG. 18. FIG. 18 is a sectional view of the synchronization assembly 103 of the hinge mechanism 1 when the electronic device is in the unfolded state according to an embodiment of this application. The synchronization assembly 103 may include a first gear connecting rod 1031 and a second gear connecting rod 1032. The first gear connecting rod 1031 and the second gear connecting rod 1032 are rotatably connected to the main shaft 102. During specific implementation, the first gear connecting rod 1031 includes a first gear 10311 and a first connecting rod 10312, and the first gear 10311 may be rotatably connected to the main shaft 102 via a fifth rotating shaft 10313, to improve stability of rotation of the first gear connecting rod 1031 around the main shaft 102, where an extension direction of an axis of the fifth rotating shaft 10313 is the same as the length direction of the hinge mechanism 1. In addition, the first housing mounting bracket 1013 is further provided with a third sliding groove 10133, the third sliding groove 10133 and the first sliding groove 10131 are disposed at a spacing, and the first connecting rod 10312 is mounted in the third sliding groove 10133 and is capable of sliding in the third sliding groove 10133 relative to the first housing mounting bracket 1013 toward or away from the base 1021, to implement a slidable connection between the first connecting rod 10312 and the first housing mounting bracket 1013.

Similarly, the second gear connecting rod 1032 may include a second gear 10321 and a second connecting rod 10322. The second gear 10321 may be rotatably connected to the main shaft 102 via a sixth rotating shaft 10323, to improve stability of rotation of the second gear connecting rod 1032 around the main shaft 102. An axis of the sixth rotating shaft 10323 is parallel to an axis of the fifth rotating shaft 10313. In addition, in this application, the second gear 10321 is connected to the first gear 10311 in a transmission manner. In this application, the transmission connection between the second gear 10321 and the first gear 10311 may be implemented through meshing between the second gear 10321 and the first gear 10311. Alternatively, an intermediate gear may be disposed between the first gear 10311 and the second gear 10321, so that the first gear 10311 and the second gear 10321 are separately meshed with an adjacent intermediate gear to implement the transmission connection between the first gear 10311 and the second gear 10321.

In addition, the second housing mounting bracket 1014 is further provided with a fourth sliding groove 10143, the fourth sliding groove 10143 and the second sliding groove 10141 are disposed at a spacing, and the second connecting rod 10322 is mounted in the fourth sliding groove 10143 and is capable of sliding in the fourth sliding groove 10143 relative to the second housing mounting bracket 1014 toward or away from the base 1021, to implement a slidable connection between the second connecting rod 10322 and the second housing mounting bracket 1014.

Figure 19:
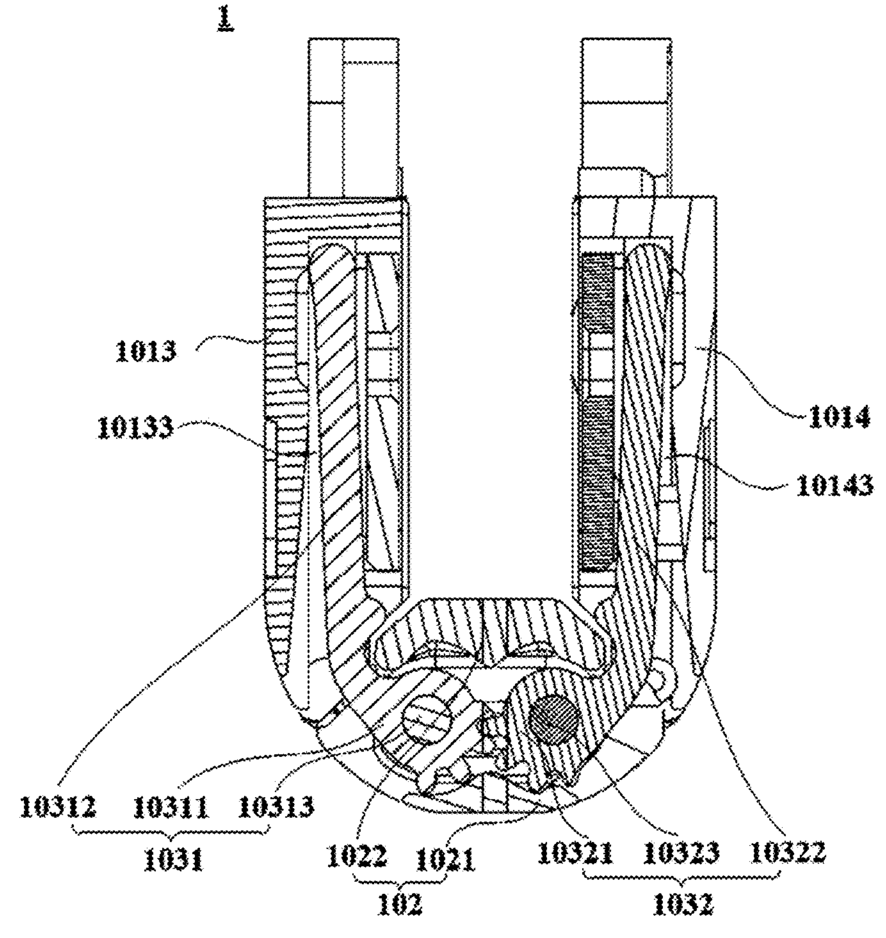
FIG. 19 is a sectional view of a synchronization assembly of a hinge mechanism when an electronic device is in a folded state according to an embodiment of this application.

Based on the foregoing descriptions of the structure of the synchronization assembly 103, refer to FIG. 18 and FIG. 19 together. FIG. 19 is a sectional view of the synchronization assembly 103 of the hinge mechanism 1 when the electronic device is in the folded state according to an embodiment of this application. In the process in which the electronic device changes from the unfolded state to the folded state, the first housing mounting bracket 1013 rotates to drive the first gear connecting rod 1031 to rotate around the base 1021. In addition, because the first gear 10311 of the first gear connecting rod 1031 is connected to the second gear 10321 of the second gear connecting rod 1032 in a transmission manner, the first gear connecting rod 1031 rotates to drive the second gear connecting rod 1032 to rotate toward the first gear connecting rod, the second gear connecting rod 1032 slides along the fourth sliding groove 10143 of the second housing mounting bracket 1014 to drive the second housing mounting bracket 1014 to rotate along the same direction. In this way, the first housing mounting bracket 1013 and the second housing mounting bracket 1014 synchronously rotate toward each other. In addition, in the process in which the electronic device changes from the folded state to the unfolded state, a movement direction of each structure is opposite to a movement direction of each structure in the foregoing process in which the electronic device changes from the unfolded state to the folded state. Details are not described herein. In this case, the first housing mounting bracket 1013 and the second housing mounting bracket 1014 synchronously move away from each other.

According to the hinge mechanism 1 provided in this application, a rotation function of the hinge mechanism 1 may be implemented through mutual pulling of the connecting rods. In addition, the two housing mounting brackets may synchronously rotate toward or away from each other by disposing the synchronization assembly 103. In addition, because structures of mechanisms for implementing the rotation function and a synchronization function of the hinge mechanism 1 are simple, the structure of the entire hinge mechanism 1 can be effectively simplified, to help implement a compact design for the hinge mechanism 1 and reduce costs of the hinge mechanism 1. Moreover, because the mechanisms for implementing the rotation function and the synchronization function of the hinge mechanism 1 are two independent mechanisms, a failure of either mechanism does not affect the implementation of the functions of the other mechanism, and the reliability of the hinge mechanism 1 can be effectively improved.

The hinge mechanism 1 provided in the foregoing embodiments of this application may be used in, for example, the electronic device shown in FIG. 1 or FIG. 2*a*. The first housing mounting bracket 1013 may be fastened to a housing located on a same side of the main shaft 102, and the second housing mounting bracket 1014 may be fastened to another housing. For example, the first housing mounting bracket 1013 may be configured to be fastened to the first housing 2 of the electronic device shown in FIG. 2*a*, and the second housing mounting bracket 1014 may be configured to be fastened to the second housing 3 of the electronic device shown in FIG. 2*a*. In view of this, it may be understood that, a process in which the first housing mounting bracket 1013 and the second housing mounting bracket 1014 synchronously rotate toward each other or away from each other is a process in which the first housing 2 and the second housing 3 synchronously rotate toward each other or away from each other.

In addition, the flexible display of the electronic device may be fastened to the first housing 2 and the second housing 3, and a connection manner may be but is not limited to bonding. During specific implementation, the flexible display may be bonded to a part of the first support surface 2*a* of the first housing 2, and the flexible display may be bonded to a part of the second support surface 3*a* of the second housing 3. In this way, when the electronic device is in the unfolded state, the bearing surface 1*a* of the hinge mechanism 1, the first support surface 2*a* of the first housing 2, and the second support surface 3*a* of the second housing 3 may jointly flatly support the flexible display. Therefore, it can be ensured that a form of the electronic device in the unfolded state is complete. In the process in which the electronic device changes from the unfolded state to the folded state, the two housings rotate toward each other to drive the flexible display to rotate. This can effectively avoid deformation of the flexible display, and reduce a risk of damage to the flexible display.

It should be understood that, to implement the form of the electronic device, this application is not limited to embodiments of the hinge mechanisms 1 mentioned above, provided that the hinge mechanisms 1 in the following states can be implemented.

When the electronic device is in the unfolded state, the bearing surface 1*a* of the hinge mechanism 1, the first support surface 2*a* of the first housing 2, and the second support surface 3*a* of the second housing 3 may jointly flatly support the flexible display. In the process in which the electronic device changes from the unfolded state to the folded state, the two housings of the electronic device may rotate toward each other, and drive the flexible display to bend. However, in the process in which the electronic device changes from the folded state to the unfolded state, the two housings of the electronic device may rotate away from each other, and drive the flexible display to unfold.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A hinge mechanism for use in a foldable electronic device, the hinge mechanism comprising:
- a main shaft provided with a first track slot and a second track slot; and
- a rotating module comprising:
  - a first rotating assembly located between a first housing mounting bracket and a second housing mounting bracket, the first rotating assembly comprising:
    - a first swing arm rotatably connected to the main shaft and slidably connected to the first housing mounting bracket,
    - a first support arm rotatably connected to the second housing mounting bracket, and
    - a first connector located between the first swing arm and the first support arm, wherein the first connector is rotatably connected to the first swing arm, rotatably connected to the first support arm, and is configured to move along the first track slot to limit a movement track of the first connector, a second rotating assembly located between the first housing mounting bracket and the second housing mounting bracket, the second rotating assembly comprising:

a second swing arm rotatably connected to the main shaft and slidably connected to the second housing mounting bracket, a second support arm rotatably connected to the first housing mounting bracket, and a second connector located between the second swing arm and the second support arm, wherein the second connector is rotatably connected to the second swing arm, rotatably connected to the second support arm, and is configured to move along the second track slot to limit a movement track of the second connector, wherein the first housing mounting bracket and the second housing mounting bracket are respectively disposed on two opposite sides of the main shaft, and wherein the hinge mechanism is configured to be disposed opposite to a foldable part of a flexible display of the electronic device, and the electronic device is configured to be unfolded or folded via the hinge mechanism, wherein:

the main shaft comprises a base and a cover, the base is provided with a first arc-shaped slot and a third arc-shaped slot, the cover covers the base, and the cover comprises a first protrusion disposed toward the first arc-shaped slot and a third protrusion disposed toward the third arc-shaped slot, a gap between a surface of the first protrusion and a slot surface of the first arc-shaped slot is configured as the first track slot, the first connector comprises a first arc-shaped surface and a second arc-shaped surface, and when the electronic device is in an unfolded state and a folded state, the first arc-shaped surface is configured to abut against the surface of the first protrusion and the second arc-shaped surface is configured to abut against the slot surface of the first arc-shaped slot, and a gap between a surface of the third protrusion and a slot surface of the third arc-shaped slot is configured as the second track slot, the second connector comprises a third arc-shaped surface and a fourth arc-shaped surface, and when the electronic device is in the unfolded state and the folded state, the third arc-shaped surface is configured to abut against the surface of the third protrusion and the fourth arc-shaped surface is configured to abut against the slot surface of the third arc-shaped slot.

2. The hinge mechanism according to claim 1, wherein:

in a process in which the electronic device changes from the unfolded state to the folded state, the first arc-shaped surface is configured to abut against the surface of the first protrusion and a gap is configured to exist between the second arc-shaped surface and the slot surface of the first arc-shaped slot;

in a process in which the electronic device changes from the folded state to the unfolded state, the second arc-shaped surface is configured to abut against the slot surface of the first arc-shaped slot and a gap is configured to exist between the first arc-shaped surface and the surface of the first protrusion;

in the process in which the electronic device changes from the unfolded state to the folded state, the third arc-shaped surface is configured to abut against the surface of the third protrusion and a gap is configured to exist between the fourth arc-shaped surface and the slot surface of the third arc-shaped slot; and in the process in which the electronic device changes from the folded state to the unfolded state, the fourth arc-shaped surface is configured to abut against the slot surface of the third arc-shaped slot and a gap is configured to exist between the third arc-shaped surface and the surface of the third protrusion.

3. The hinge mechanism according to claim 1, wherein:

the surface of the first protrusion is equidistant from the slot surface of the first arc-shaped slot, and in processes in which the electronic device changes from the unfolded state to the folded state and from the folded state to the unfolded state, the first arc-shaped surface is configured to abut against the surface of the first protrusion and the second arc-shaped surface is configured to abut against the slot surface of the first arc-shaped slot; and the surface of the third protrusion is equidistant from the slot surface of the third arc-shaped slot, and in the processes in which the electronic device changes from the unfolded state to the folded state and from the folded state to the unfolded state, the third arc-shaped surface is configured to abut against the surface of the third protrusion and the fourth arc-shaped surface is configured to abut against the slot surface of the third arc-shaped slot.

4. The hinge mechanism according to claim 1, wherein:

the first arc-shaped surface is a circular arc surface, the second arc-shaped surface is a circular arc surface, and a sum of a radius of the first arc-shaped surface and a radius of the second arc-shaped surface is equal to a spacing between the surface of the first protrusion and the slot surface of the first arc-shaped slot; and the third arc-shaped surface is a circular arc surface, the fourth arc-shaped surface is a circular arc surface, and a sum of a radius of the third arc-shaped surface and a radius of the fourth arc-shaped surface is equal to a spacing between the surface of the third protrusion and the slot surface of the third arc-shaped slot.

5. A hinge mechanism for use in a foldable electronic device, the hinge mechanism comprising:

a main shaft provided with a first track slot and a second track slot; and a rotating module comprising:

a first rotating assembly located between a first housing mounting bracket and a second housing mounting bracket, the first rotating assembly comprising:

a first swing arm rotatably connected to the main shaft and slidably connected to the first housing mounting bracket, a first support arm rotatably connected to the second housing mounting bracket, and a first connector located between the first swing arm and the first support arm, wherein the first connector is rotatably connected to the first swing arm, rotatably connected to the first support arm, and is configured to move along the first track slot to limit a movement track of the first connector, a second rotating assembly located between the first housing mounting bracket and the second housing mounting bracket, the second rotating assembly comprising:

a second swing arm rotatably connected to the main shaft and slidably connected to the second housing mounting bracket, a second support arm rotatably connected to the first housing mounting bracket, and a second connector located between the second swing arm and the second support arm, wherein the second connector is rotatably connected to the second swing arm, rotatably connected to the second support arm, and is configured to move along the second track slot to limit a movement track of the second connector, wherein:

the first housing mounting bracket and the second housing mounting bracket are respectively disposed on two opposite sides of the main shaft, the hinge mechanism is configured to be disposed opposite to a foldable part of a flexible display of the electronic device, and the electronic device is configured to be unfolded or folded via the hinge mechanism, the main shaft comprises a base, and the base is provided with a second arc-shaped slot and a fourth arc-shaped slot, the first swing arm comprises a first arc-shaped rotating block, the first arc-shaped rotating block is accommodated in the second arc-shaped slot, and the first arc-shaped rotating block is configured to slide along a slot surface of the second arc-shaped slot to enable rotatable connection between the first swing arm and the main shaft, and the second swing arm comprises a second arc-shaped rotating block, the second arc-shaped rotating block is accommodated in the fourth arc-shaped slot, and the second arc-shaped rotating block is configured to slide along a slot surface of the fourth arc-shaped slot to enable rotatable connection between the second swing arm and the main shaft.

6. The hinge mechanism according to claim 5, wherein:

the main shaft further comprises a cover, the cover covers the base, the cover comprises a second protrusion disposed toward the second arc-shaped slot, and at least a part of the first arc-shaped rotating block is located between the second protrusion and the second arc-shaped slot; and the cover further comprises a fourth protrusion disposed toward the fourth arc-shaped slot, and at least a part of the second arc-shaped rotating block is located between the fourth protrusion and the fourth arc-shaped slot.

7. The hinge mechanism according to claim 5, wherein:

the first connector comprises a first rotating shaft and a second rotating shaft, the first connector is rotatably connected to the first swing arm via the first rotating shaft, the first connector is rotatably connected to the first support arm via the second rotating shaft, and an axis of the first rotating shaft is parallel to and does not coincide with an axis of the second rotating shaft; and the second connector comprises a third rotating shaft and a fourth rotating shaft, the second connector is rotatably connected to the second swing arm via the third rotating shaft, the second connector is rotatably connected to the second support arm via the fourth rotating shaft, and an axis of the third rotating shaft is parallel to and does not coincide with an axis of the fourth rotating shaft.

8. The hinge mechanism according to claim 7, wherein:

the first arc-shaped rotating block is provided with a first mounting slot, a slot opening of the first mounting slot is disposed toward the second arc-shaped slot, the first rotating shaft is mounted in the first mounting slot, a part of a surface of the first rotating shaft is in contact with a slot surface of the first mounting slot, and a part of the surface of the first rotating shaft is in contact with the slot surface of the second arc-shaped slot; and the second arc-shaped rotating block is provided with a second mounting slot, a slot opening of the second mounting slot is disposed toward the fourth arc-shaped slot, the third rotating shaft is mounted in the second mounting slot, a part of a surface of the third rotating shaft is in contact with a slot surface of the second mounting slot, and a part of the surface of the third rotating shaft is in contact with the slot surface of the fourth arc-shaped slot.

9. The hinge mechanism according to claim 8, wherein:

the slot surface of the first mounting slot comprises a first circular arc surface, the surface of the first rotating shaft that is in contact with the slot surface of the first mounting slot is a second circular arc surface, and a center of the first circular arc surface coincides with a center of the second circular arc surface; and the slot surface of the second mounting slot comprises a fifth circular arc surface, the surface of the third rotating shaft that is in contact with the slot surface of the second mounting slot is a sixth circular arc surface, and a center of the fifth circular arc surface coincides with a center of the sixth circular arc surface.

10. The hinge mechanism according to claim 9, wherein:

the slot surface of the second arc-shaped slot is a third circular arc surface, the surface of the first rotating shaft that is in contact with the slot surface of the second arc-shaped slot is a fourth circular arc surface, and a center of the third circular arc surface coincides with a center of the fourth circular arc surface; and the slot surface of the fourth arc-shaped slot is a seventh circular arc surface, the surface of the third rotating shaft that is in contact with the slot surface of the fourth arc-shaped slot is an eighth circular arc surface, and a center of the seventh circular arc surface coincides with a center of the eighth circular arc surface.

11. The hinge mechanism according to claim 1, wherein an axis center at which the first swing arm rotates around the main shaft is located on one side of the main shaft that is away from the flexible display, and an axis center at which the second swing arm rotates around the main shaft is located on one side of the main shaft that is away from the flexible display.

12. The hinge mechanism according to claim 1, wherein:

the first connector comprises a plurality of first sub-connectors that are sequentially rotatably connected, the plurality of first sub-connectors are located between the first swing arm and the first support arm, the first swing arm is rotatably connected to a first sub-connector adjacent to the first swing arm, and the first support arm is rotatably connected to a first sub-connector adjacent to the first support arm; and the second connector comprises a plurality of second sub-connectors that are sequentially rotatably connected, the plurality of second sub-connectors are located between the second swing arm and the second support arm, the second swing arm is rotatably connected to a first adjacent second sub-connector, and the second support arm is rotatably connected to a second adjacent second sub-connector.

13. The hinge mechanism according to claim 1, further comprising a synchronization assembly, the synchronization assembly comprising:

a first gear connecting rod comprising:

a first gear rotatably connected to the main shaft via a fifth rotating shaft, and a first connecting rod slidably connected to the first housing mounting bracket, wherein the first housing mounting bracket is provided with a third sliding groove, and the first connecting rod is mounted in the third sliding groove and is configured to slide in the third sliding groove relative to the first housing mounting bracket toward or away from the main shaft; and a second gear connecting rod comprising:

a second gear rotatably connected to the main shaft via a sixth rotating shaft, wherein the first gear is transmissively connected to the second gear, and a second connecting rod slidably connected to the second housing mounting bracket, wherein the second housing mounting bracket is provided with a fourth sliding groove, and the second connecting rod is mounted in the fourth sliding groove and is configured to slide in the fourth sliding groove relative to the second housing mounting bracket toward or away from the main shaft.

14. An electronic device, comprising:

a first housing;

a second housing;

a flexible display continuously covering the first housing, the second housing, and a hinge mechanism, wherein the flexible display is fastened to the first housing and the second housing; and the hinge mechanism disposed opposite to a foldable part of the flexible display, wherein the first housing and the second housing are respectively disposed on two opposite sides of the hinge mechanism, a first housing mounting bracket is fastened to the first housing, and a second housing mounting bracket is fastened to the second housing, and wherein the electronic device is configured to be unfolded or folded via the hinge mechanism, the hinge mechanism comprising:

a main shaft provided with a first track slot and a second track slot, and a rotating module comprising:

a first rotating assembly located between the first housing mounting bracket and the second housing mounting bracket, the first rotating assembly comprising:

a first swing arm rotatably connected to the main shaft and slidably connected to the first housing mounting bracket, a first support arm rotatably connected to the second housing mounting bracket, and a first connector located between the first swing arm and the first support arm, wherein the first connector is rotatably connected to the first swing arm, rotatably connected to the first support arm, and is configured to move along the first track slot to limit a movement track of the first connector, and a second rotating assembly located between the first housing mounting bracket and the second housing mounting bracket, the second rotating assembly comprising:

a second swing arm rotatably connected to the main shaft and slidably connected to the second housing mounting bracket, a second support arm rotatably connected to the first housing mounting bracket, and a second connector located between the second swing arm and the second support arm, wherein the second connector is rotatably connected to the second swing arm, rotatably connected to the second support arm, and is configured to move along the second track slot to limit a movement track of the second connector, wherein:

the main shaft comprises a base and a cover, the base is provided with a first arc-shaped slot and a third arc-shaped slot, the cover covers the base, and the cover comprises a first protrusion disposed toward the first arc-shaped slot and a third protrusion disposed toward the third arc-shaped slot, a gap between a surface of the first protrusion and a slot surface of the first arc-shaped slot is configured as the first track slot, the first connector comprises a first arc-shaped surface and a second arc-shaped surface, and when the electronic device is in an unfolded state and a folded state, the first arc-shaped surface is configured to abut against the surface of the first protrusion and the second arc-shaped surface is configured to abut against the slot surface of the first arc-shaped slot, and a gap between a surface of the third protrusion and a slot surface of the third arc-shaped slot is configured as the second track slot, the second connector comprises a third arc-shaped surface and a fourth arc-shaped surface, and when the electronic device is in the unfolded state and the folded state, the third arc-shaped surface is configured to abut against the surface of the third protrusion and the fourth arc-shaped surface is configured to abut against the slot surface of the third arc-shaped slot.

15. The electronic device according to claim 14, wherein:

in a process in which the electronic device changes from the unfolded state to the folded state, the first arc-shaped surface is configured to abut against the surface of the first protrusion and a gap is configured to exist between the second arc-shaped surface and the slot surface of the first arc-shaped slot;

in a process in which the electronic device changes from the folded state to the unfolded state, the second arc-shaped surface is configured to abut against the slot surface of the first arc-shaped slot and a gap is configured to exist between the first arc-shaped surface and the surface of the first protrusion;

in the process in which the electronic device changes from the unfolded state to the folded state, the third arc-shaped surface is configured to abut against the surface of the third protrusion and a gap is configured to exist between the fourth arc-shaped surface and the slot surface of the third arc-shaped slot; and in the process in which the electronic device changes from the folded state to the unfolded state, the fourth arc-shaped surface is configured to abut against the slot surface of the third arc-shaped slot and a gap is configured to exist between the third arc-shaped surface and the surface of the third protrusion.

16. The electronic device according to claim 14, wherein:

the surface of the first protrusion is equidistant from the slot surface of the first arc-shaped slot, and in processes in which the electronic device changes from the unfolded state to the folded state and from the folded state to the unfolded state, the first arc-shaped surface is configured to abut against the surface of the first protrusion and the second arc-shaped surface is configured to abut against the slot surface of the first arc-shaped slot; and the surface of the third protrusion is equidistant from the slot surface of the third arc-shaped slot, and in the processes in which the electronic device changes from the unfolded state to the folded state and from the folded state to the unfolded state, the third arc-shaped surface is configured to abut against the surface of the third protrusion and the fourth arc-shaped surface is configured to abut against the slot surface of the third arc-shaped slot.

17. The electronic device according to claim 14, wherein:

the first arc-shaped surface is a circular arc surface, the second arc-shaped surface is a circular arc surface, and a sum of a radius of the first arc-shaped surface and a radius of the second arc-shaped surface is equal to a spacing between the surface of the first protrusion and the slot surface of the first arc-shaped slot; and the third arc-shaped surface is a circular arc surface, the fourth arc-shaped surface is a circular arc surface, and a sum of a radius of the third arc-shaped surface and a radius of the fourth arc-shaped surface is equal to a spacing between the surface of the third protrusion and the slot surface of the third arc-shaped slot.

18. The electronic device according to claim 14, wherein:

the base is further provided with a second arc-shaped slot and a fourth arc-shaped slot;

the first swing arm comprises a first arc-shaped rotating block, the first arc-shaped rotating block is accommodated in the second arc-shaped slot, and the first arc-shaped rotating block is configured to slide along a slot surface of the second arc-shaped slot to enable rotatable connection between the first swing arm and the main shaft; and the second swing arm comprises a second arc-shaped rotating block, the second arc-shaped rotating block is accommodated in the fourth arc-shaped slot, and the second arc-shaped rotating block is configured to slide along a slot surface of the fourth arc-shaped slot to enable rotatable connection between the second swing arm and the main shaft.

19. A method of operating the electronic device according to claim 14, the method comprising rotating the first housing and the second housing toward each other, wherein:

the electronic device changes from the unfolded state to the folded state;

the first connector moves along the first track slot toward the first swing arm, wherein driving the first support arm is driven to rotate around the main shaft; and the second connector moves along the second track slot toward the second swing arm, wherein the second support arm is driven to rotate around the main shaft.

20. The method according to claim 19, further comprising rotating the first housing and the second housing away from each other, wherein:

the electronic device changes from the folded state to the unfolded state;

the first connector moves along the first track slot toward the first support arm, wherein the first support arm is driven to rotate around the main shaft; and the second connector moves along the second track slot toward the second support arm, wherein the second support arm is driven to rotate around the main shaft.

* * * * *